US012775360B2

(12) United States Patent
Lee et al.

(10) Patent No.: US 12,775,360 B2

(45) Date of Patent: Oct. 27, 2026

(54) DISPLAY DEVICE

(71) Applicant: Samsung Display Co., Ltd., Yongin-si (KR)

(72) Inventors: Seung Jae Lee, Seoul (KR); Han Soo Kim, Asan-si (KR); Kyung Min Park, Cheonan-si (KR); Tae Jong Eom, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/659,479

(22) Filed: May 9, 2024

(65) Prior Publication Data

US 2024/0288978 A1 Aug. 29, 2024

Related U.S. Application Data

(60) Division of application No. 17/485,259, filed on Sep. 24, 2021, now Pat. No. 12,014,015, which is a (Continued)

(30) Foreign Application Priority Data

Jan. 29, 2019 (KR) ........................ 10-2019-0011065

(51) Int. Cl.

*G06F 3/044* (2006.01)
*H05K 1/02* (2006.01)
*H10K 59/40* (2023.01)

(52) U.S. Cl.

CPC .......... *G06F 3/0446* (2019.05); *G06F 3/0443* (2019.05); *H05K 1/0277* (2013.01); (Continued)

(58) Field of Classification Search

CPC ...... H10K 59/40; H10K 59/131; H10K 59/88; G06F 3/0443; G06F 3/0446; (Continued)

(56) References Cited

U.S. PATENT DOCUMENTS 9,000,428 B2 4/2015 Lee et al.
10,304,921 B2 5/2019 Lee et al.
(Continued)

FOREIGN PATENT DOCUMENTS

CN 205609530 U 9/2016
CN 107464800 A 12/2017
(Continued)

*Primary Examiner* — Sarvesh J Nadkarni

(74) *Attorney, Agent, or Firm* — CANTOR COLBURN LLP

(57) ABSTRACT

A display device includes a first substrate including a display area and a non-display area, which is on the periphery of the display area, a light-emitting element disposed on the first substrate and in the display area, a display signal line which is disposed on the first substrate and in the display area, extends in a first direction, and transmits a signal to the light-emitting element, a common voltage supply line disposed on the first substrate and in the non-display area, a pad disposed on the first substrate and in the non-display area, and electrically connected to the display signal line, and an indentation pad disposed on the first substrate and in the non-display area, and electrically connected to the common voltage supply line, where the indentation pad is disposed closer than the pad to edges of the first substrate in a second direction, which intersects the first direction.

8 Claims, 19 Drawing Sheets

Related U.S. Application Data continuation of application No. 16/743,965, filed on Jan. 15, 2020, now Pat. No. 11,132,096.

(52) U.S. Cl.
CPC ... *H10K 59/40* (2023.02); *G06F 2203/04107* (2013.01); *H05K 2201/056* (2013.01)

(58) Field of Classification Search
CPC ........ G06F 2203/04107; H05K 1/0259; H05K 1/0277; H05K 1/147; H05K 1/117; H05K 2201/10128; H05K 2201/10106; H05K 2201/09918; H05K 2201/0969; H05K 2201/056
See application file for complete search history.

(56) References Cited

U.S. PATENT DOCUMENTS

| | | | | |
|---|---|---|---|---|
| 10,553,668 | B2 | 2/2020 | Lee et al. | |
| 10,826,015 | B2 | 11/2020 | Yu et al. | |
| 11,835,983 | B1 * | 12/2023 | Li | G06F 3/0412 |
| 2007/0076393 | A1 | 4/2007 | Jeong et al. | |
| 2009/0026932 | A1 | 1/2009 | Kwak et al. | |
| 2012/0229416 | A1 * | 9/2012 | Ku | G06F 3/0443 345/174 |
| 2013/0038542 | A1 * | 2/2013 | Kim | G06F 3/041 345/173 |
| 2013/0176279 | A1 * | 7/2013 | Chen | G06F 3/0446 345/174 |
| 2014/0226086 | A1 * | 8/2014 | Chu | G06F 3/04164 349/12 |
| 2016/0064364 | A1 | 3/2016 | Shin et al. | |
| 2016/0132148 | A1 | 5/2016 | Han et al. | |
| 2016/0224153 | A1 | 8/2016 | Bae et al. | |
| 2017/0031489 | A1 | 2/2017 | Kim et al. | |
| 2017/0098769 | A1 | 4/2017 | Im | |
| 2017/0153726 | A1 * | 6/2017 | Lee | G06F 3/0445 |
| 2017/0364194 | A1 | 12/2017 | Jang et al. | |
| 2018/0120996 | A1 | 5/2018 | Kang et al. | |
| 2018/0228037 | A1 | 8/2018 | Fujikawa | |
| 2018/0337364 | A1 | 11/2018 | Kwon et al. | |
| 2019/0036073 | A1 * | 1/2019 | Yu | H10K 59/131 |
| 2019/0081129 | A1 | 3/2019 | Sung et al. | |
| 2019/0095022 | A1 | 3/2019 | Kwon et al. | |
| 2019/0138134 | A1 | 5/2019 | Ikeda et al. | |
| 2019/0165079 | A1 | 5/2019 | Cho et al. | |
| 2019/0252639 | A1 | 8/2019 | Lee | |
| 2019/0304921 | A1 | 10/2019 | Kuroe et al. | |
| 2020/0287159 | A1 | 9/2020 | Lee et al. | |
| 2020/0313092 | A1 | 10/2020 | You et al. | |
| 2020/0321292 | A1 | 10/2020 | Park et al. | |
| 2020/0379595 | A1 | 12/2020 | Kim | |

FOREIGN PATENT DOCUMENTS

| | | | |
|---|---|---|---|
| CN | 107680984 | A | 2/2018 |
| CN | 207909880 | U | 9/2018 |
| CN | 108766994 | A | 11/2018 |
| CN | 109148418 | A | 1/2019 |
| EP | 3301550 | A1 | 4/2018 |
| KR | 1020120075114 | | 7/2012 |
| KR | 1020140133053 | A | 11/2014 |
| KR | 1020160070257 | | 6/2016 |
| KR | 1020170073482 | A | 6/2017 |
| KR | 1020170077665 | A | 7/2017 |
| KR | 1020180138251 | A | 12/2018 |

* cited by examiner

DISPLAY DEVICE

This application is a divisional of U.S. patent application Ser. No. 17/485,259, filed on Sep. 24, 2021, which is a continuation of U.S. patent application Ser. No. 16/743,965, filed on Jan. 15, 2020, which claims priority to Korean Patent Application No. 10-2019-0011065, filed on Jan. 29, 2019, and all the benefits accruing therefrom under 35 U.S.C. § 119, the content of which in its entirety is herein incorporated by reference.

BACKGROUND

1. Field

Exemplary embodiments of the invention relate to a display device.

2. Description of the Related Art

A display device visually displays data. Examples of the display device include a liquid crystal display ("LCD") device and an organic light-emitting diode ("OLED") display device. The OLED display device has excellent luminance and viewing angle characteristics, as compared to the LCD device, and can be implemented as an ultrathin display device because the OLED display device does not need a backlight module.

The display device may include a display area in which images are displayed and a non-display area which is disposed on the periphery of the display area, and wires may be provided in the non-display area.

SUMMARY

A non-display area, which is adjacent to edges of a display device, is susceptible to static electricity. Thus, when strong static electricity is introduced into the display device, wires of the display device may be damaged by the static electricity.

Exemplary embodiments of the invention provide a display device with improved reliability.

However, the invention is not restricted to those set forth herein. The above and other exemplary embodiments of the invention will become more apparent to one of ordinary skill in the art to which the invention pertains by referencing the detailed description of the invention given below.

An exemplary embodiment of a display device includes a first substrate including a display area and a non-display area, which is on a periphery of the display area, a light-emitting element disposed on the first substrate and in the display area, a display signal line which is disposed on the first substrate and in the display area, extends in a first direction, and transmits a signal to the light-emitting element, a common voltage supply line disposed on the first substrate and in the non-display area, a pad disposed on the first substrate and in the non-display area, and electrically connected to the display signal line, and an indentation pad disposed on the first substrate and in the non-display area, and electrically connected to the common voltage supply line, where the indentation pad is disposed closer than the pad to edges of the first substrate in a second direction, which intersects the first direction.

An exemplary embodiment of a display device includes a substrate including a display area and a non-display area, which is on a periphery of the display area, a light-emitting element disposed on the substrate and in the display area, a display signal line which is disposed on the substrate and in the display area, extends in a first direction, and transmits a signal to the light-emitting element, a common voltage supply line disposed on the substrate and in the non-display area, a first pad disposed on the substrate and in the non-display area, and electrically connected to the display signal line, and an alignment pad disposed on the substrate and in the non-display area, and electrically connected to the common voltage supply line, where the alignment pad includes a first pad portion extending in a second direction, which intersects the first direction, and a second pad portion directly connected to the first pad portion and extending in the first direction.

According to the aforementioned and other exemplary embodiments of the invention, a display device with improved reliability may be provided.

BRIEF DESCRIPTION OF THE DRAWINGS

The above and other exemplary embodiments and features of the invention will become more apparent by describing in detail embodiments thereof with reference to the attached drawings, in which.

DETAILED DESCRIPTION

Figure 1:
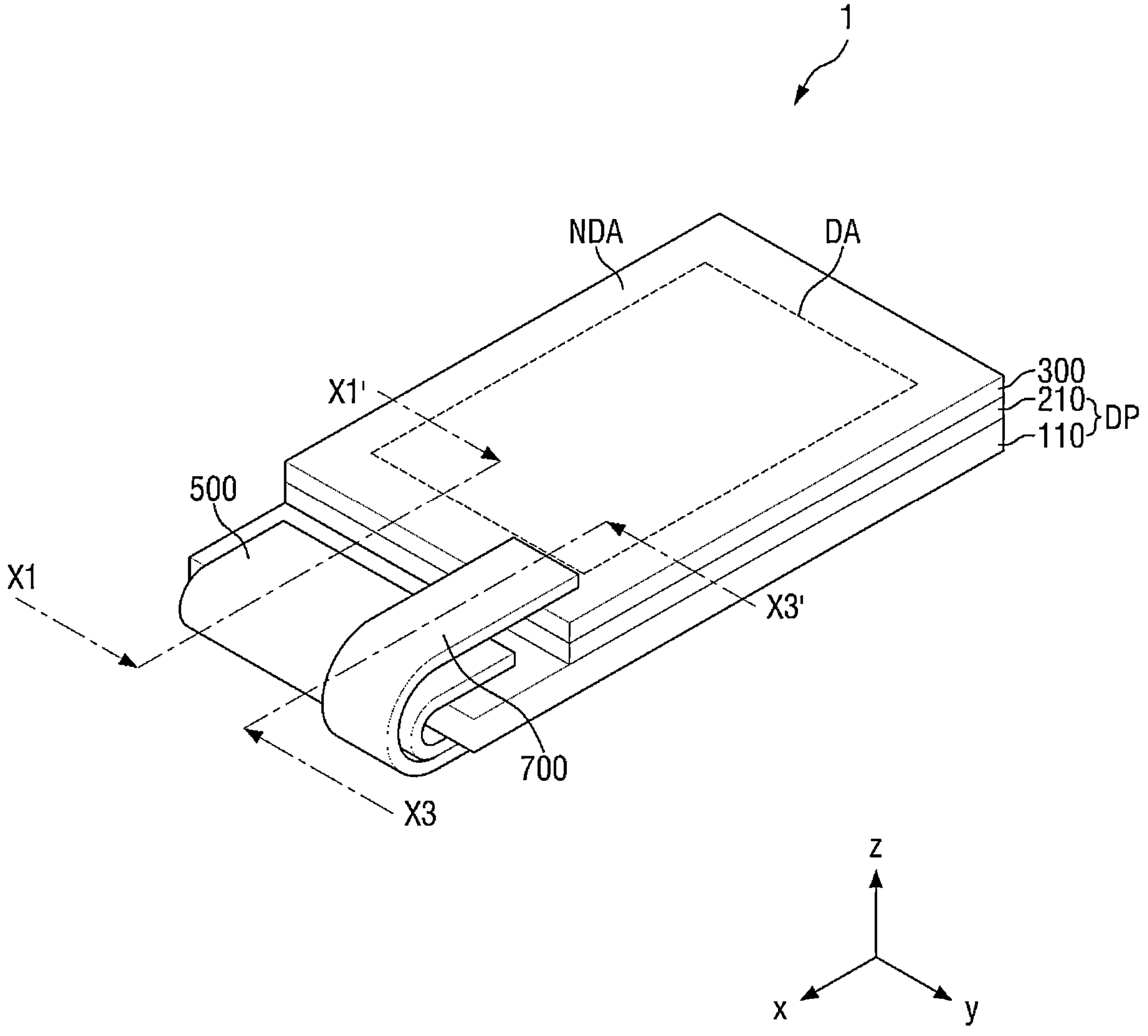
FIG. 1 is a perspective view of an exemplary embodiment of a display device according to the invention.

Features of the invention and methods of accomplishing the same may be understood more readily by reference to the following detailed description of embodiments and the accompanying drawings. The invention may, however, be embodied in many different forms and should not be construed as being limited to the exemplary embodiments set forth herein. Rather, these embodiments are provided so that this invention will be thorough and complete and will fully convey the concept of the invention to those skilled in the art, and the invention will only be defined by the appended claims. Like reference numerals refer to like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Exemplary embodiments of the inventive subject matter are described herein with reference to plan and perspective illustrations that are schematic illustrations of idealized exemplary embodiments of the inventive subject matter. As such, variations from the shapes of the illustrations as a result, for example, of manufacturing techniques and/or tolerances, are to be expected. Therefore, the exemplary embodiments of the invention is not limited to specific features but may include variations depending on the fabricating processes. Therefore, the regions illustrated in the drawings have schematic attributes, and the shapes of the regions illustrated in the drawings are for illustrating specific shapes and are not for limiting the scope of the invention.

In the accompanying drawings, like reference numerals indicate like elements.

Exemplary embodiments of the invention will hereinafter be described with reference to the accompanying drawings.

Figure 2:
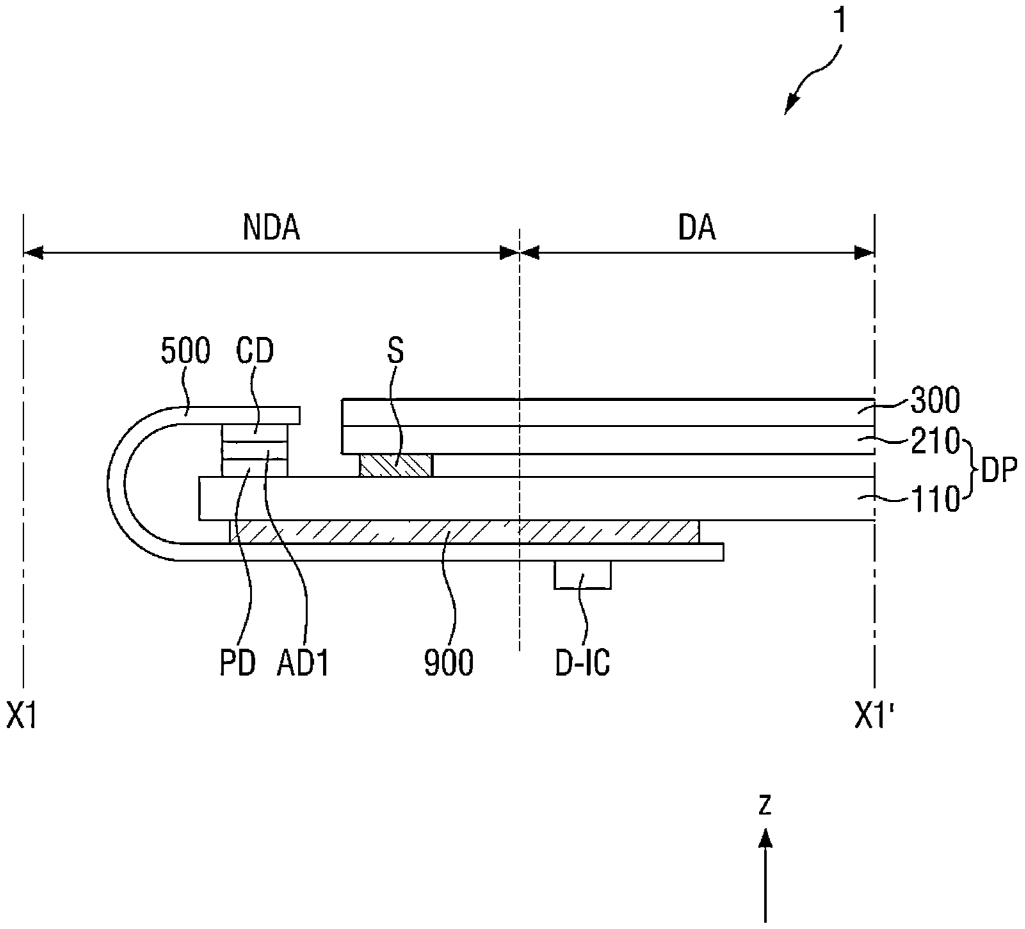
FIG. 2 is a cross-sectional view taken along line X1-X1' of FIG. 1.
Figure 3:
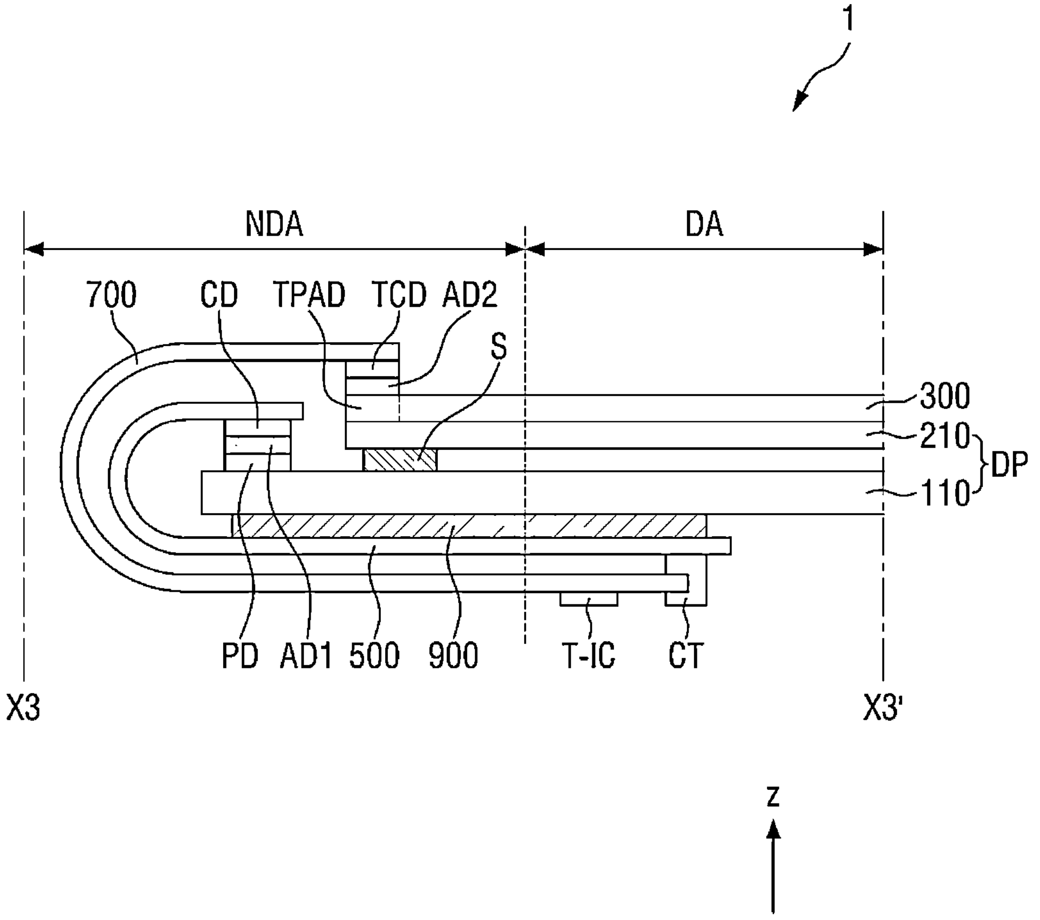
FIG. 3 is a cross-sectional view taken along line X3-X3' of FIG. 1.

FIG. 1 is a perspective view of an exemplary embodiment of a display device according to the invention, FIG. 2 is a cross-sectional view taken along line X1-X1' of FIG. 1, and FIG. 3 is a cross-sectional view taken along line X3-X3' of FIG. 1.

Referring to FIGS. 1 through 3, a display device 1 may include a display panel DP, a touch sensing layer 300 disposed on the display panel DP, and a flexible printed circuit board ("FPCB") 500 connected to the display panel DP. The display device 1 may further include a touch FPCB 700 connected to the touch sensing layer 300.

In some exemplary embodiments, the display panel DP may have a rectangular shape in a plan view. The display panel DP may include a pair of long sides extending in a first direction x and a pair of short sides extending in a second direction y, which intersects the first direction x. The corners at which the long sides and the short sides of the display panel DP meet may be right-angled, but the invention is not limited thereto. In an alternative exemplary embodiment, the corners at which the long sides and the short sides of the display panel DP meet may be rounded or may be chamfered to reduce the risk of breakage. However, the planar shape of the display panel DP is not particularly limited, and the display panel DP may have a shape other than a rectangular shape, such as a circular shape, in a plan view.

In a plan view, the display panel DP may include a display area DA and a non-display area NDA. The display area DA is an area in which images are displayed, and the non-display area NDA is an area in which no images are displayed. In some exemplary embodiments, the non-display area NDA may be disposed on the periphery of the display area DA and may surround the display area DA.

Unless specified otherwise, the terms "on", "upper", "above", and "top", as used herein, refer to a third direction z, which intersects the first and second directions x and y, and the terms "below", "lower", "under", and "bottom", as used herein, refer to the direction opposite to the third direction z.

In some exemplary embodiments, the display panel DP may be a rigid display panel or a flexible display panel.

In some exemplary embodiments, the display panel DP may be a display panel including self-luminous elements. Examples of the self-luminous elements may include organic light-emitting diodes ("OLEDs"), quantum-dot light-emitting diodes ("QLEDs"), inorganic micro light-emitting diodes ('mLEDs"), and inorganic nano-light-emitting diodes ("nano-LEDs"). For convenience, the self-luminous elements will hereinafter be described as being, for example, OLEDs.

The display panel DP includes a first substrate 110, a second substrate 210 disposed on the first substrate 110, an element layer disposed between the first and second substrates 110 and 210, and a pad portion PD disposed on the first substrate 110. The display panel DP may further include a sealing member S, which is disposed between the first and second substrates 110 and 210 along the sides of each of the first and second substrates 110 and 210 and couples the first and second substrates 110 and 210.

The first substrate 110 is a substrate supporting the element layer and the pad portion PD. In some exemplary embodiments, the first substrate 110 may be an insulating substrate including glass, quartz, ceramic, or plastic.

The element layer is disposed on the first substrate 110. In some exemplary embodiments, the element layer may include a plurality of pixels and a plurality of display signal lines which are disposed on the first substrate 110 and are located in the display area DA. Each of the pixels may include a thin-film transistor ("TFT"), a capacitor, and a light-emitting element. The display signal lines may include scan lines transmitting scan signals to the pixels and data lines transmitting data signals to the pixels.

The element layer may further include elements and wires which are disposed on the first substrate 110 and are located in the non-display area NDA. The elements and the wires may generate various signals that are to be applied to the pixels or may transmit the generated signals to the pixels.

The pad portion PD may be disposed on the first substrate 110 and may be located in the non-display area NDA. The pad portion PD may be disposed on one side of the display device 1, but the invention is not limited thereto. The pad portion PD may be connected to the FPCB 500, which transmits signals and voltages from the outside of the display device 1.

The second substrate 210 may be an encapsulation substrate preventing external moisture and/or oxygen from infiltrating into the display area DA. The second substrate 210 may be provided as a polymer film using glass or plastic. The second substrate 210 may have a smaller size than that of the first substrate 110 and may cover the first substrate 110 and the pixels disposed in the display area DA. In some exemplary embodiments, the second substrate 210 may not overlap with the pad portion PD. That is, the length, in the first direction x, of the second substrate 210 may be smaller than the length, in the first direction x, of the first substrate 110.

The sealing member S may be disposed between the first and second substrates 110 and 210. The sealing member S may be located in the non-display area NDA and may be disposed to completely surround the display area DA in a plan view. The sealing member S may bond the first and second substrates 110 and 210 together and may prevent external impurities such as moisture or oxygen from infiltrating between the first and second substrates 110 and 210. In some exemplary embodiments, the sealing member S may be provided by providing a sealing material such as glass frit between the first and second substrates 110 and 210 and applying laser light to the sealing material to melt the sealing material.

The touch sensing layer 300 may be disposed on the display panel DP. In some exemplary embodiments, the touch sensing layer 300 may acquire the coordinates of a touch input location in a capacitive manner. Specifically, the touch sensing layer 300 may acquire coordinate information of a touch point in a self-capacitance manner or a mutual capacitance manner. For convenience, the touch sensing layer 300 will hereinafter be described as being of, for example, a mutual capacitance type, but the invention is not limited thereto.

In some exemplary embodiments, the touch sensing layer 300 may be disposed on the display panel DP, particularly, on the second substrate 210.

In some exemplary embodiments, a part of the touch sensing layer 300 disposed in the display area DA may include touch electrodes (not illustrated), and a part of the touch sensing layer 300 disposed in the non-display area NDA may include touch signal lines (not illustrated) transmitting signals to and/or receiving signals from the touch electrodes and a touch pad portion TPAD connected to the touch signal lines.

In some exemplary embodiments, the touch electrodes, the touch signal lines, and the touch pad portion TPAD of the touch sensing layer 300 may be disposed on the second substrate 210. In other words, a bonding layer (e.g., an adhesive layer) may not be disposed between the touch sensing layer 300 and the second substrate 210. In an exemplary embodiment, at least one of the touch electrodes, the touch signal lines, and the touch pad portion TPAD of the touch sensing layer 300 may be disposed directly on the second substrate 210, for e, for example. In an alternative exemplary embodiment, in a case where an insulating film is provided between the touch sensing layer 300 and the second substrate 210, at least one of the touch electrodes, the touch signal lines, and the touch pad portion TPAD of the touch sensing layer 300 may be disposed directly on the insulating film.

The FPCB 500 may be connected to the display panel DP. In some exemplary embodiments, the FPCB 500 may include a terminal portion CD corresponding to the pad portion PD, and the terminal portion CD of the FPCB 500 may be electrically connected to the pad portion PD.

The FPCB 500 may be bent to face the bottom surface of the display panel DP or the bottom surface of the first substrate 110, and a part of the FPCB 500 facing the bottom surface of the display panel DP may be fixed to the bottom surface of the display panel DP or the bottom surface of the first substrate 110.

In some exemplary embodiments, the part of the FPCB 500 facing the bottom surface of the display panel DP may be fixed to the bottom surface of the display panel DP or the bottom surface of the first substrate 110 via a coupling member 900. The coupling member 900 may include a conductive material. In an exemplary embodiment, the coupling member 900 may be provided as a double-sided tape including a copper (Cu) layer, for example. In a case where the coupling member 900 includes a conductive material, static electricity introduced into the FPCB 500 may be dispersed to the coupling member 900. As a result, static electricity may be prevented from being introduced into the display panel DP, or the amount of static electricity introduced into the display panel DP may be reduced.

In some exemplary embodiments, the part of the FPCB 500 facing the bottom surface of the display panel DP may partially overlap with the display area DA. Since the FPCB 500 is bent down toward the bottom of the display panel DP, the bezel size of the display device 1 may be reduced.

In some exemplary embodiments, a driver D-IC may be disposed (e.g., mounted) on the FPCB 500 as an integrated circuit ("IC") chip. The driver D-IC may output driving power and driving signals, and the driving signals may be provided to the pixels of the display panel DP via the terminal portion CD of the FPCB 500 and the pad portion PD of the display panel DP. In some exemplary embodiments, the driver D-IC may be a data driving circuit providing data signals to the pixels in the display area DA. In some exemplary embodiments, the driver D-IC may overlap with the display area DA, but the invention is not limited thereto.

In some exemplary embodiments, an anisotropic conductive film AD1 may be disposed between the pad portion PD and the terminal portion CD of the FPCB 500, and the pad portion PD and the terminal portion CD may be physically and/or electrically coupled to each other via the anisotropic conductive film AD1. The anisotropic conductive film AD1, which is an adhesive film for connecting circuits, may have anisotropic properties that exhibit conductivity in one direction (e.g., in a thickness direction) and dielectricity in another direction (e.g., in a surface direction). The anisotropic conductive film AD1 includes an insulating layer having adhesiveness (e.g., a thermosetting insulating layer) and a plurality of conductive balls disposed in the insulating layer.

In some exemplary embodiments, a connecting portion CT may be further disposed on the FPCB 500. The connecting portion CT may be connected to the touch FPCB 700. In some exemplary embodiments, the connecting portion CT may be provided as a connector.

The touch FPCB 700 may be connected to the touch sensing layer 300. In some exemplary embodiments, the touch FPCB 700 may include a touch terminal portion TCD corresponding to the touch pad portion TPAD, and the touch terminal portion TCD may be electrically connected to the touch pad portion TPAD.

In some exemplary embodiments, an anisotropic conductive film AD2 may be disposed between the touch pad portion TPAD of the touch FPCB 700 and the touch terminal portion TCD of the touch sensing layer 300, and the touch terminal portion TCD and the touch pad portion TPAD may be physically and/or electrically connected via the anisotropic conductive film AD2.

In some exemplary embodiments, the touch FPCB 700 may be bent toward the bottom surface of the display panel DP or the bottom surface of the first substrate 110 and may be connected to the connecting portion CT, which is provided on the FPCB 500, at the bottom of the display panel DP.

In some exemplary embodiments, a part of the touch FPCB 700 disposed below the display panel DP may partially overlap with the display area DA.

In some exemplary embodiments, a touch driver T-IC may be disposed (e.g., mounted) on the touch FPCB 700 as an IC chip. The touch driver T-IC may output touch driving signals, and the touch driving signals may be provided to the touch electrodes of the touch sensing layer 300 via the touch terminal portion TCD and the touch pad portion TPAD of the touch FPCB 700. The touch driver T-IC may receive touch sensing signals from the touch sensing layer 300 and may generate touch information such as information regarding the presence of touch input and the location of the touch input by processing the touch sensing signals. In some exemplary embodiments, the touch driver T-IC may overlap with the display area DA, but the invention is not limited thereto.

The display panel DP will hereinafter be described with reference to FIGS. 4 through 13.

Figure 4:
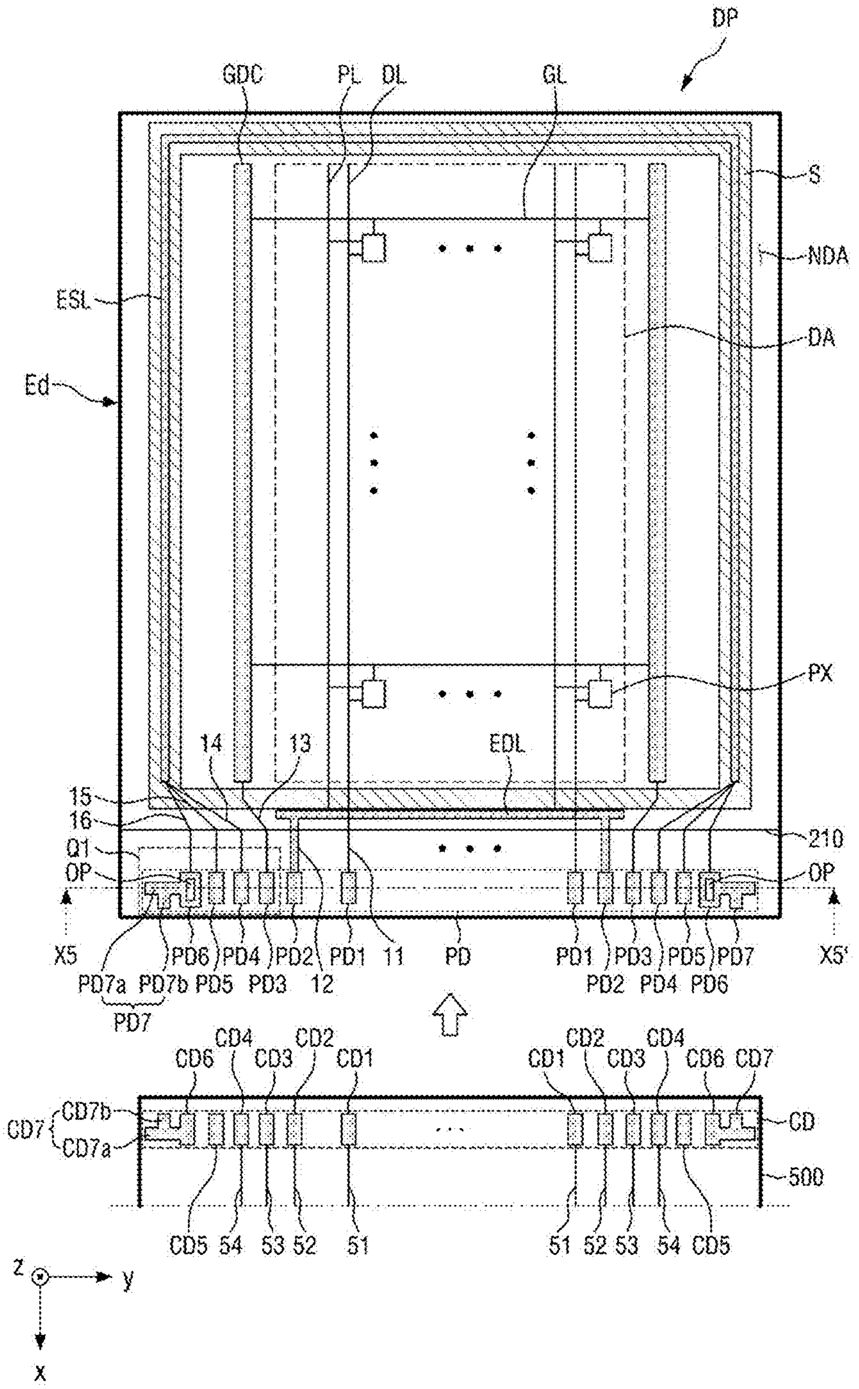
FIG. 4 is a plan view illustrating a display panel of the display device of FIG. 1 and a part of a flexible printed circuit board ("FPCB") coupled to the display panel.
Figure 5:
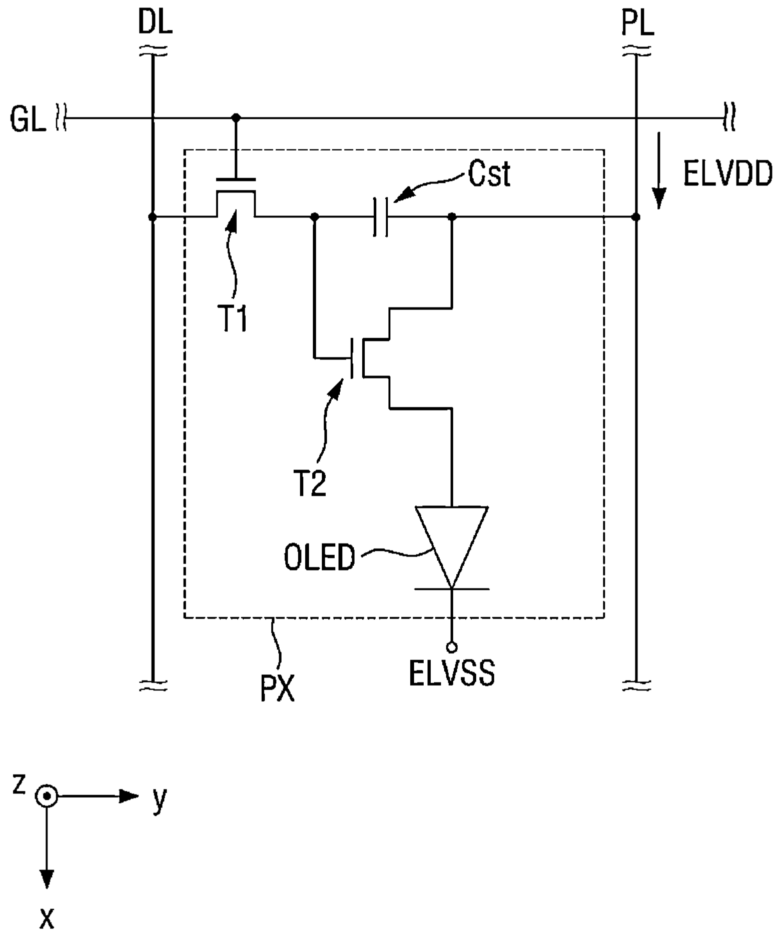
FIG. 5 is an equivalent circuit diagram illustrating a pixel of FIG. 4.
Figure 6:
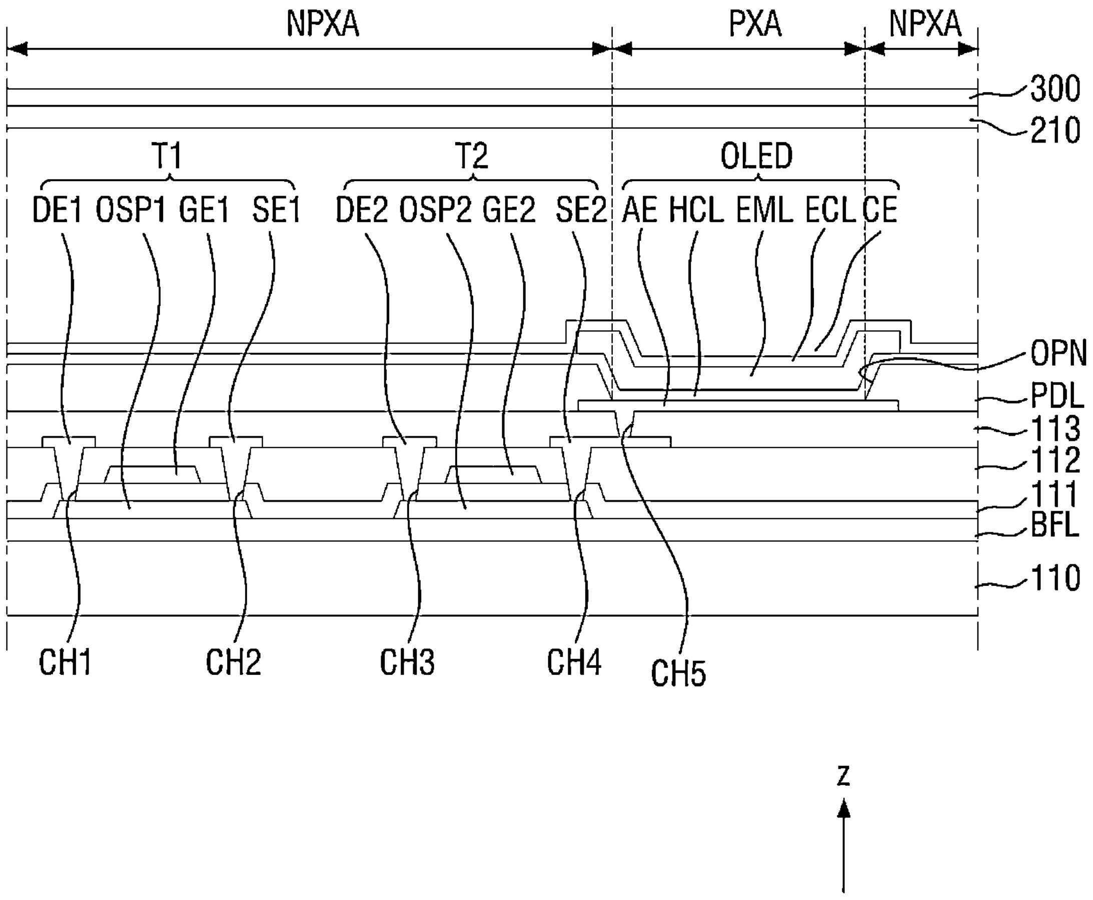
FIG. 6 is a cross-sectional view illustrating the pixel of FIG. 4.
Figure 7:
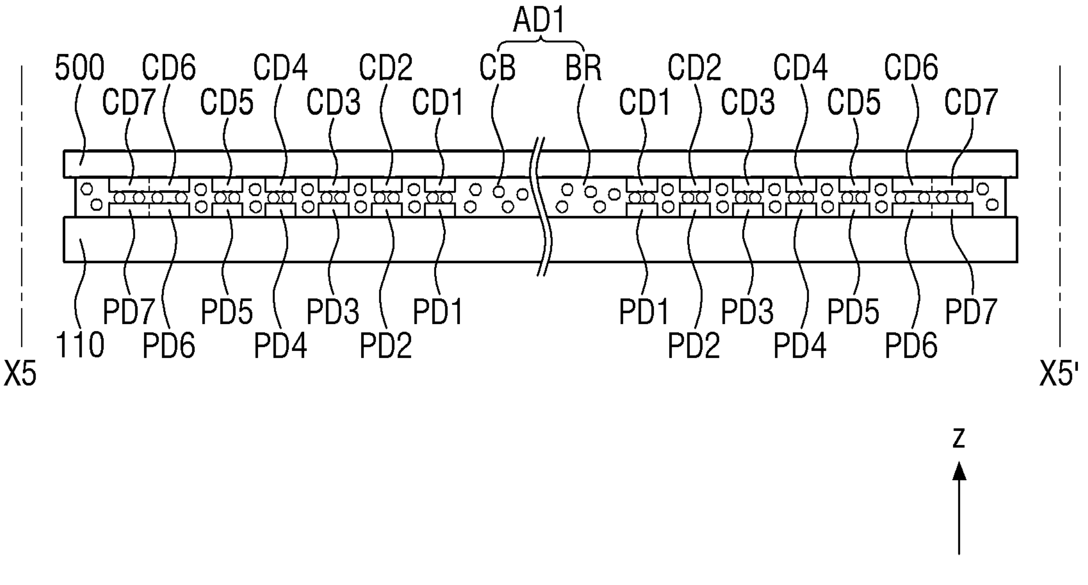
FIG. 7 is a cross-sectional view taken along line X5-X5' of FIG. 4.
Figure 8:
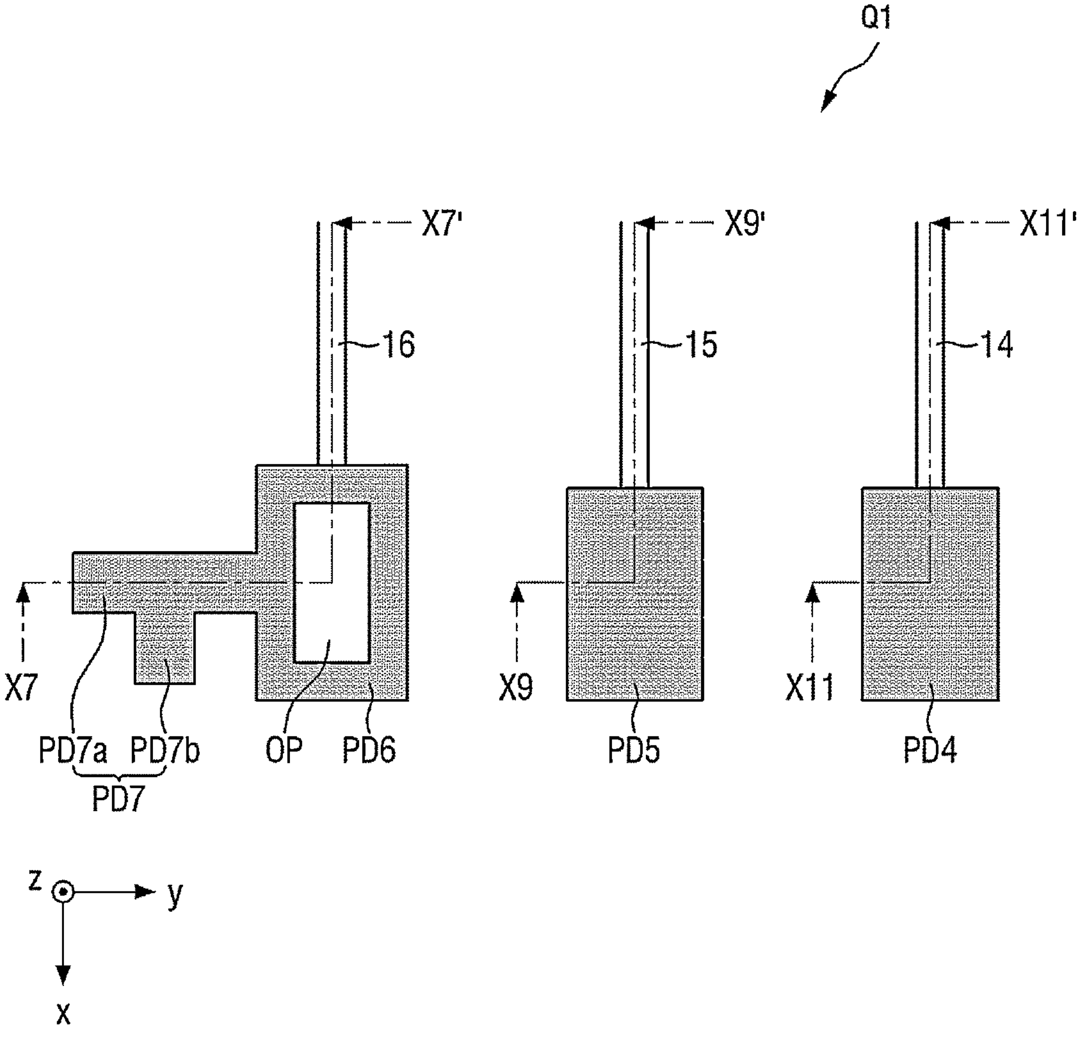
FIG. 8 is an enlarged plan view illustrating a part Q1 of FIG. 4.
Figure 9:
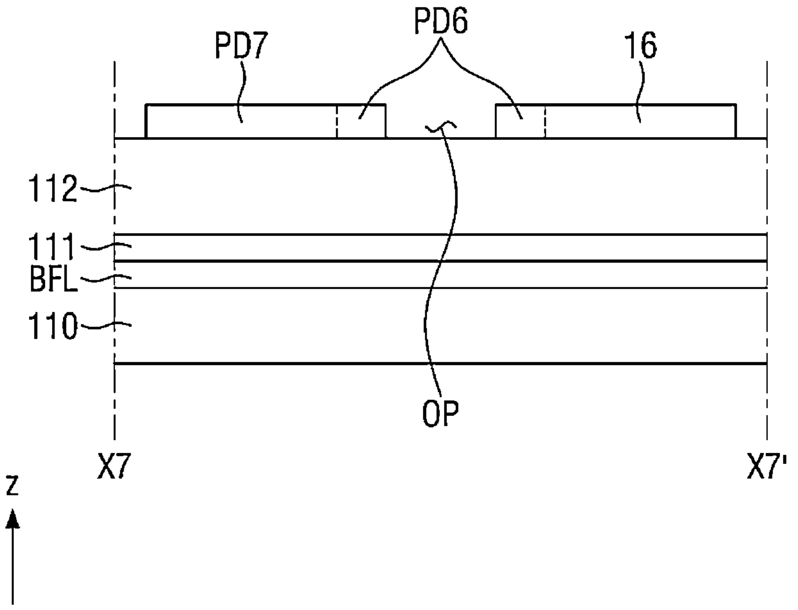
FIG. 9 is a cross-sectional view taken along line X7-X7' of FIG. 8.
Figure 10:
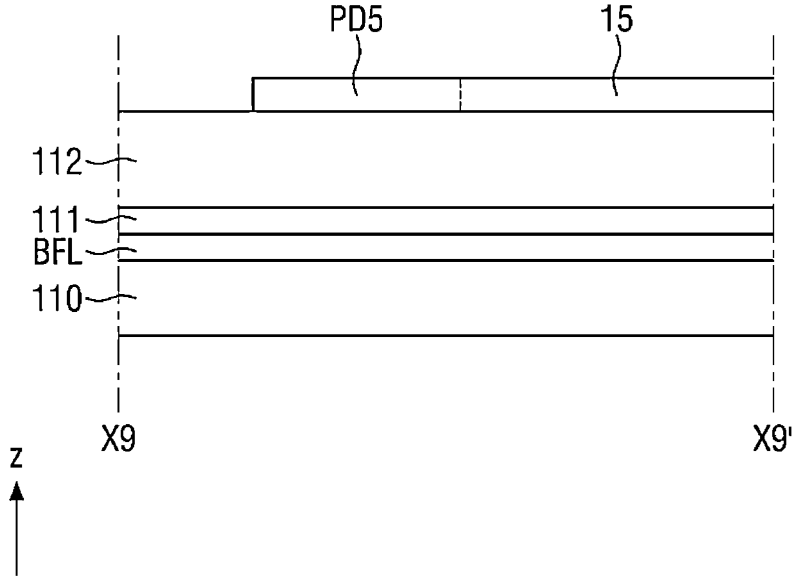
FIG. 10 is a cross-sectional view taken along line X9-X9' of FIG. 8.
Figure 11:
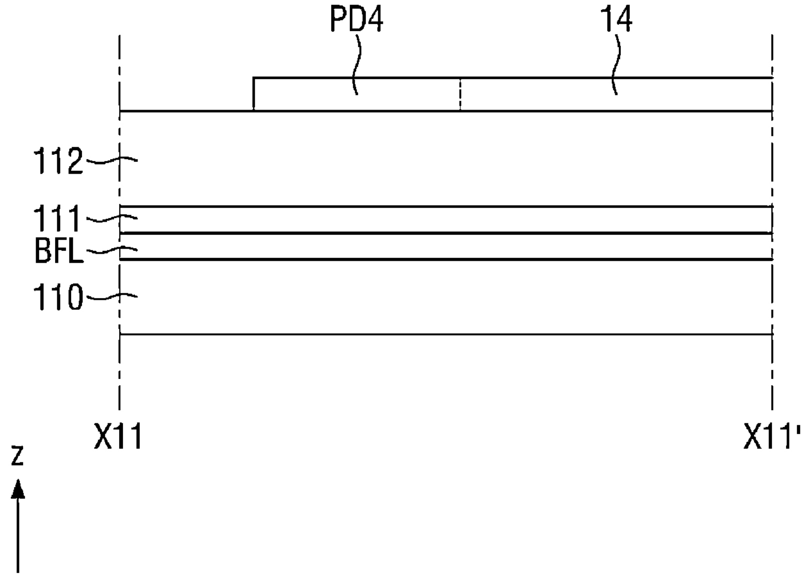
FIG. 11 is a cross-sectional view taken along line X11-X11' of FIG. 8.
Figure 12:
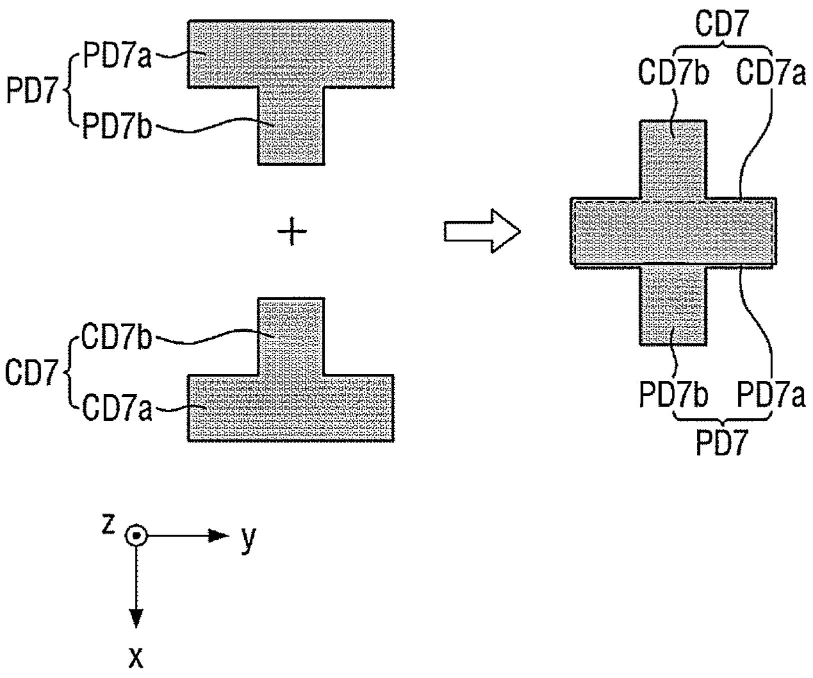
FIG. 12 is a schematic view illustrating how to align a seventh pad and a seventh terminal of FIG. 5.
Figure 13:
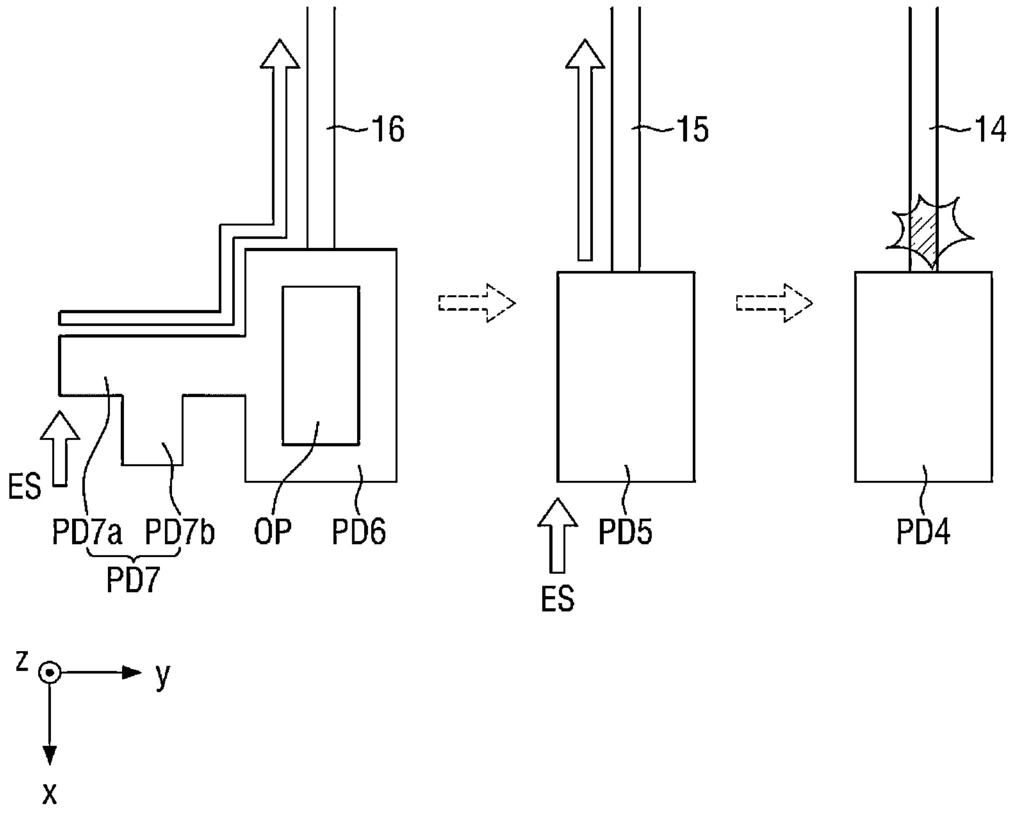
FIG. 13 is a schematic view illustrating the path of movement of static electricity introduced from the outside of the display device of FIG. 1 in the structure illustrated in FIG. 8.

FIG. 4 is a plan view illustrating the display panel of the display device of FIG. 1 and a part of the FPCB coupled to the display panel, FIG. 5 is an equivalent circuit diagram illustrating a pixel of FIG. 4, FIG. 6 is a cross-sectional view illustrating the pixel of FIG. 4, FIG. 7 is a cross-sectional view taken along line X5-X5' of FIG. 4, FIG. 8 is an enlarged plan view illustrating a part Q1 of FIG. 4, FIG. 9 is a cross-sectional view taken along line X7-X7' of FIG. 8, FIG. 10 is a cross-sectional view taken along line X9-X9' of FIG. 8, FIG. 11 is a cross-sectional view taken along line X11-X11' of FIG. 8, FIG. 12 is a schematic view illustrating how to align a seventh pad and a seventh terminal of FIG. 5, and FIG. 13 is a schematic view illustrating the path of movement of static electricity introduced from the outside of the display device of FIG. 1 in the structure illustrated in FIG. 8.

Referring to FIGS. 4 through 13, the display panel DP includes the display area DA and the non-display area NDA, which is disposed on the periphery of the display area DA.

As illustrated in FIG. 4, in the display area DA, scan lines GL, data lines DL, power lines PL, and a plurality of pixels PX may be disposed on the first substrate 110.

In the non-display area NDA, the pad portion PD, driving circuits GDC, a common voltage supply line ESL, a driving voltage supply line EDL, connecting lines (11, 12, 13, 14, 15, and 16), and the sealing member S, which surrounds the display area DA, may be disposed on the first substrate 110.

The scan lines GL are connected to the plurality of pixels PX to transmit scan signals to the plurality of pixels PX.

The data lines DL are connected to the plurality of pixels PX to transmit data signals to the plurality of pixels PX.

The power lines PL are connected to the plurality of pixels PX to provide driving voltages to the plurality of pixels PX.

In some exemplary embodiments, the scan lines GL may extend in the second direction y, and the data lines DL may extend in the first direction x. In some exemplary embodiments, the power lines PL may extend in the same direction as the data lines DL, i.e., in the first direction x, but the invention is not limited thereto.

FIG. 5 illustrates one scan line GL, one data line DL, one power line PL, and a pixel PX connected to the scan line GL, the data line DL, and the power line PL. The structure of the plurality of pixels PX of FIG. 4, however, is not particularly limited, but may vary.

Referring to FIG. 5, an OLED may be a top emission OLED or a bottom emission OLED. The pixel PX of FIG. 5 includes a first transistor (also referred to as "a switching transistor") T1, a second transistor (also referred to as "a driving transistor") T2, and a capacitor Cst as pixel driving circuitry for driving the OLED. A first power supply voltage ELVDD is provided to the second transistor T2, and a second power supply voltage ELVSS is provided to the OLED. The second power supply voltage ELVSS may be lower than the first power supply voltage ELVDD.

The first transistor T1 outputs a data signal applied to the data line DL to which the pixel PX of FIG. 5 is connected in response to a scan signal applied to the scan line GL to which the pixel PX of FIG. 5 is connected. The capacitor Cst is charged with a voltage corresponding to the data signal output by the first transistor T1. The second transistor T2 is connected to the OLED. The second transistor T2 controls a driving current flowing in the OLED in accordance with the amount of charge stored in the capacitor Cst.

The structure of the pixel PX of FIG. 5 is merely exemplary, and the invention is not limited thereto. The pixel PX of FIG. 5 may include more than two transistors and more than one capacitor. The OLED may be connected between the second transistor T2 and the power line PL to which the pixel PX of FIG. 5 is connected.

FIG. 6 illustrates a part of the display panel DP corresponding to the pixel PX of FIG. 5.

Referring to FIG. 6, a buffer film BFL may be disposed on the first substrate 110.

A first semiconductor pattern OSP1 of the first transistor T1 and a second semiconductor pattern OSP2 of the second transistor T2 may be disposed on the buffer film BFL. The first and second semiconductor patterns OSP1 and OSP2 may include a material selected from among amorphous silicon, polysilicon, and a metal oxide semiconductor. In some exemplary embodiments, one of the first and second semiconductor patterns OSP1 and OSP2 may include polysilicon, and the other semiconductor pattern may include a metal oxide semiconductor.

A first interlayer inorganic film 111 may be disposed on the first and second semiconductor patterns OSP1 and OSP2. A first control electrode GE1 of the first transistor T1 and a second control electrode GE2 of the second transistor T2 may be disposed on the first interlayer inorganic film (also referred to as "first interlayer insulating film") 111. In a case where the first and second control electrodes GE1 and GE2 are disposed in the same layer, the first and second control electrodes GE1 and GE2 may be fabricated by the same photolithography process as the scan lines GL of FIG. 4, but the invention is not limited thereto. The first and second control electrodes GE1 and GE2 may be disposed in different layers, in which case, only one of the first and second control electrodes GE1 and GE2 may be fabricated by the same photolithography process as the scan lines GL of FIG. 4.

A second interlayer insulating film 112, which covers the first and second control electrodes GE1 and GE2, may be disposed on the first interlayer insulating film 111. A first input electrode DE1 and a first output electrode SE1 of the first transistor T1 and a second input electrode DE2 and a second output electrode SE2 of the second transistor T2 may be disposed on the second interlayer insulating film 112.

The first input electrode DE1 and the first output electrode SE1 may be connected to the first semiconductor pattern OSP1 through first and second through holes CH1 and CH2, respectively, that penetrate the first and second interlayer insulating films 111 and 112. The second input electrode DE2 and the second output electrode SE2 may be connected to the second semiconductor pattern OSP2 through third and fourth through holes CH3 and CH4, respectively, that penetrate the first and second interlayer insulating films 111 and 112. In some exemplary embodiments, at least one of the first and second transistors T1 and T2 may have a bottom gate structure.

A middle organic film 113, which covers the first input electrode DE1, the second input electrode DE2, the first output electrode SE1, and the second output electrode SE2, may be disposed on the second interlayer insulating film 112. The middle organic film 113 may provide a flat surface.

A pixel defining film PDL and the OLED may be disposed on the middle organic film 113. The pixel defining film PDL may include an organic material. A first electrode AE may be disposed on the middle organic film 113. The first electrode AE is connected to the second output electrode SE2 through a fifth through hole CH5 that penetrates the middle organic film 113. An opening OPN is defined on the pixel defining film PDL. The opening OPN of the pixel defining film PDL exposes at least part of the first electrode AE. In another exemplary embodiment, the pixel defining film PDL may not be provided.

The pixel PX of FIG. 5 may be disposed in the display area DA. The display area DA may include a light-emitting area PXA and a non-light-emitting area NPXA, which is adjacent to the light-emitting area PXA. The non-light-emitting area NPXA may surround the light-emitting area PXA. The light-emitting area PXA is defined to correspond to the part of the first electrode AE exposed by the opening OPN.

The light-emitting are PXA may overlap with at least one of the first and second transistors T1 and T2. The opening OPN may become wider, and the first electrode AE and a light-emitting layer EML, which will be described later, may also become wider.

A hole control layer HCL may be disposed in both the light-emitting area PXA and the non-light-emitting area NPXA. Although not specifically illustrated, a common layer such as the hole control layer HCL may be provided in common in all the plurality of pixels PX of FIG. 4.

The light-emitting layer EML is disposed on the hole control layer HCL. The light-emitting layer EML may be disposed in an area corresponding to the opening OPN. That is, the light-emitting layer EML may be provided in the pixel PX of FIG. 5 as a separate pattern from light-emitting layers EML provided in other pixels PX. The light-emitting layer EML may include an organic material and/or an inorganic material. The light-emitting layer EML may generate color light of a predetermined color.

The light-emitting layer EML is illustrated as being a patterned layer, but the invention is not limited thereto. In an alternative exemplary embodiment, the light-emitting layer EML may be a non-patterned common layer provided in common in all the plurality of pixels PX, in which case, the light-emitting layer EML may generate white light, for example. In an alternative exemplary embodiment, the light-emitting layer EML may have a multilayer structure referred to as a tandem.

An electron control layer ECL is disposed on the light-emitting layer EML. Although not specifically illustrated, the electron control layer ECL may be provided in common in all the plurality of pixels PX of FIG. 4. The second electrode CE is disposed on the electron control layer ECL. The second electrode CE is disposed in common in all the plurality of pixels PX.

The second substrate 210 may be disposed on the second electrode CE, and the second electrode CE and the second substrate 210 may be spaced apart from each other. The touch sensing layer 300 may be disposed on the second substrate 210.

As illustrated in FIG. 4, the driving circuits GDC may be disposed on the left or right side of the display area DA. FIG. 4 illustrates that two driving circuits GDC are provided and are disposed on both the left and right sides of the display area DA, but the invention is not limited thereto. In an alternative exemplary embodiment, the driving circuits GDC may be disposed on only one side of the display area DA.

The driving circuits GDC may include a scan driving circuit. The driving circuits GDC may be connected to the scan lines GL. The driving circuits GDC may generate a plurality of scan signals and may sequentially output the scan signals to the scan lines GL. In some exemplary embodiments, the driving circuits GDC may include a plurality of thin film transistors ("TFTs") provided by the same process as the driving circuits of the plurality of pixels PX, e.g., a low temperature polycrystalline silicon ("LTPS") process or a low temperature polycrystalline oxide ("LTPO") process, for example.

In the non-display area NDA, the driving circuits GDC may be disposed on the first substrate 110. In some exemplary embodiments, the driving circuits GDC may be disposed on the left or right side of the display area DA. FIG. 4 illustrates that two driving circuits GDC are provided and are disposed on both the left and right sides of the display area DA, but the invention is not limited thereto. In an alternative exemplary embodiment, the driving circuits GDC may be disposed on only one side of the display area DA.

The driving voltage supply line EDL may be disposed in the non-display area NDA, particularly, between the pad portion PD and the display area DA. The driving voltage supply line EDL may be connected to the power lines PL, and driving voltages may be provided to the plurality of pixels PX via the driving voltage supply line EDL and the power lines PL.

The common voltage supply line ESL is disposed in the non-display area NDA and provides a common voltage to the second electrode CE of the OLED of the pixel PX of FIG. 5. In some exemplary embodiments, the common voltage supply line ESL may extend along all edges ED of the first substrate 110, except for the edge ED corresponding to the pad portion PD, in the form of a loop with one side opened.

In some exemplary embodiments, the common voltage supply line ESL may at least partially overlap with the sealing member S. FIG. 4 illustrates that the common voltage supply line ESL completely overlaps with the sealing member S, but the invention is not limited thereto. In an alternative exemplary embodiment, at least part of the common voltage supply line ESL may not overlap with the sealing member S.

In some exemplary embodiments, the common voltage supply line ESL and the driving voltage supply line EDL may be disposed in the same layer and may include the same material. In some exemplary embodiments, the common voltage supply line ESL and the driving voltage supply line EDL may include the same material as that of the first input electrode DE1 and the first output electrode SE1 of FIG. 6 and may be disposed in the same layer as the first input electrode DE1 and the first output electrode SE1 of FIG. 6.

The pad portion PD may be disposed in the non-display area NDA, and the pad portion PD and the display area DA may be disposed on opposite sides of the driving voltage supply line EDL.

The pad portion PD may include first pads PD1, second pads PD2, third pads PD3, fourth pads PD4, fifth pads PD5, sixth pads PD6, and seventh pads PD7.

The first pads PD1 are electrically connected to the data lines DL, and the data signals provided by the driver D-IC are provided to the plurality of pixels PX via the first pads PD1 and the data lines DL. In some exemplary embodiments, a plurality of first pads PD1 may be arranged along the second direction y.

Second, third, fourth, fifth, sixth, and seventh pads PD2, PD3, PD4, PD5, PD6, and PD7 may be disposed on one side (e.g., on the left side) of each of the first pads PD1 along the second direction y. FIG. 4 illustrates that second, third, fourth, fifth, sixth, and seventh pads PD2, PD3, PD4, PD5, PD6, and PD7 are sequentially arranged on one side of each of the first pads PD1 along the second direction y, but the invention is not limited thereto. The order of arrangement of the second pads PD2, the third pads PD3, the fourth pads PD4, the fifth pads PD5, the sixth pads PD6, and the seventh pads PD7 may vary.

In some exemplary embodiments, second, third, fourth, fifth, sixth, and seventh pads PD2, PD3, PD4, PD5, PD6, and PD7 may be further disposed on the other side (e.g., on the right side) of each of the first pads PD1 along the second direction y.

The second pads PD2 are electrically connected to the driving voltage supply line EDL, and driving voltages may be provided to the plurality of pixels PX via the FPCB 500, the second pads PD2, the driving voltage supply line EDL, and the power lines PL.

The third pads PD3 are electrically connected to the driving circuits GDC. Control signals (e.g., a vertical synchronization signal, a horizontal synchronization signal, a clock signal, and the like) generated by an external circuit connected to the FPCB 500 may be provided to the driving circuits GDC via the FPCB 500 and the third pads PD3.

The fourth pads PD4 are electrically connected to the common voltage supply line ESL. Driving voltages may be provided to the plurality of pixels PX via the FPCB 500, the fourth pads PD4, and the common voltage supply line ESL. In some exemplary embodiments, the fourth pads PD4 may be disposed on one side of the second pads PD2 along the second direction y, but the invention is not limited thereto.

The fifth pads PD5 may be dummy pads. The fifth pads PD5 may be coupled to fifth terminals CD5 of the FPCB 500 and may improve the coupling force between the FPCB 500 and the display panel DP.

The fifth pads PD5 may be disposed closer than the first pads PD1, the second pads PD2, the third pads PD3, and the fourth pads PD4 to the edges ED of the display panel DP in the second direction y.

In some exemplary embodiments, the fifth pads PD5 may be electrically connected to the common voltage supply line ESL.

The sixth pads PD6 may be indentation pads for inspecting indentations.

In some exemplary embodiments, each of the sixth pads PD6 may include a light-transmitting part OP. That is, each of the sixth pads PD6 may include a light-transmitting part OP and a metal part surrounding the light-transmitting part OP.

As illustrated in FIG. 7, the anisotropic conductive film AD1, which couples the FPCB 500 to the display panel DP, includes an insulating layer BR and a plurality of conductive balls CB disposed in the insulating layer BR, and the pad portion PD and the terminal portion CD may be electrically connected by the conductive balls CB. Thus, the number of conductive balls CB between the pads of the pad portion PD and the terminals of the terminal portion CD is highly related to the connection reliability between the pad portion PD and the terminal portion CD.

Since each of the sixth pads PD6 includes the light-transmitting part OP, the number of conductive balls CB between the sixth pads PD6 and sixth terminals CD6, which will be described later, may be easily identified, as viewed from the bottom to the top of the first substrate 110, even when the FPCB 500 and the display panel DP are coupled together. Accordingly, the total number of conductive balls CB between the pads of the pad portion PD and the terminals of the terminal portion CD may be estimated, and as a result, the connection reliability between the FPCB 500 and the display panel DP may be identified.

In some exemplary embodiments, the sixth pads PD6, like the fifth pads PD5, may be electrically connected to the common voltage supply line ESL. The sixth pads PD6 may be disposed closer than the fifth pads PD5 to the edges ED (e.g., the left and right edges) of the display panel DP.

The seventh pads PD7 may be alignment pads for aligning the display panel DP with other elements. In an exemplary embodiment, the seventh pads PD7 may be for aligning the FPCB 500 with the display panel DP and may be aligned with seventh terminals CD7 of the FPCB 500, for example.

In some exemplary embodiments, the seventh pads PD7 may be electrically connected to the common voltage supply line ESL. The seventh pads PD7 may be disposed closer than the sixth pads PD6 to the edges ED (e.g., the left and right edges) of the display panel DP.

In some exemplary embodiments, the seventh pads PD7 may include first pad portions PD7*a* extending in the second direction y and second pad portions PD7*b* connected to the first pad portions PD7*a* and extending in the first direction x. The first pad portions PD7*a* may be connected directly to the sixth pads PD6, and the seventh pads PD7 may be electrically connected to the common voltage supply line ESL via the sixth pads PD6.

In some exemplary embodiments, the first pads PD1, the second pads PD2, the third pads PD3, the fourth pads PD4, the fifth pads PD5, the sixth pads PD6, and the seventh pads PD7 may include the same material as that of the first input electrode DE1 and the first output electrode SE1 of FIG. 6 and may be disposed in the same layer as the first input electrode DE1 and the first output electrode SE1 of FIG. 6.

The connecting lines (11, 12, 13, 14, 15, and 16) may be disposed in the non-display area NDA and may include first connecting lines 11, second connecting lines 12, third connecting lines 13, fourth connecting lines 14, fifth connecting lines 15, and sixth connecting lines 16.

The first connecting lines 11 may be connected to the data lines D1 and the first pads PD1, and the data lines DL and the first pads PD1 may be electrically connected by the first connecting lines 11.

The second connecting lines 12 may be connected to the driving voltage supply line EDL and the second pads PD2, and the driving voltage supply line EDL and the second pads PD2 may be electrically connected by the second connecting lines 12.

The third connecting lines 13 may be connected to the driving circuits GDC and the third pads PD3, and the driving circuits GDC and the third pads PD3 may be electrically connected by the third connecting lines 13.

The fourth connecting lines 14 may be connected to the common voltage supply line ESL and the fourth pads PD4, and the common voltage supply line ESL and the fourth pads PD4 may be electrically connected by the fourth connecting lines 14.

The fifth connecting lines 15 may be connected to the common voltage supply line ESL and the fifth pads PD5, and the common voltage supply line ESL and the fifth pads PD5 may be electrically connected by the fifth connecting lines 15.

The sixth connecting lines 16 may be connected to the common voltage supply line ESL and the sixth pads PD6, and the common voltage supply line ESL and the sixth pads PD6 may be electrically connected by the sixth connecting lines 16.

In some exemplary embodiments, at least some of the connecting lines (11, 12, 13, 14, 15, and 16) may include the same material as that of the first input electrode DE1 and the first output electrode SE1 of FIG. 6 and may be disposed in the same layer as the first input electrode DE1 and the first output electrode SE1 of FIG. 6. In an exemplary embodiment, the fourth connecting lines 14, the fifth connecting lines 15, and the sixth connecting lines 16 may include the same material as that of the first input electrode DE1 and the first output electrode SE1 of FIG. 6 and may be disposed in the same layer as the first input electrode DE1 and the first output electrode SE1 of FIG. 6, and the first connecting lines 11, the second connecting lines 12, and the third connecting lines 13 may be disposed in the same layer as the scan lines GL and may include the same material as that of the scan lines GL, for example.

The FPCB 500 may include the terminal portion CD, which is coupled to the pad portion PD of the display panel DP, and the terminal portion CD may include first terminals CD1, second terminals CD2, third terminals CD3, fourth terminals CD4, the fifth terminals CD5, the sixth terminals CD6, and the seventh terminals CD7.

The first terminals CD1 may be connected to the first pads PD1 via the anisotropic conductive film AD1. The first terminals CD1 may be connected to the driver D-IC of FIG. 2 via first terminal lines 51 and may receive data signals from the driver D-IC of FIG. 2.

The second terminals CD2 may be connected to the second pads PD2 via the anisotropic conductive film AD1. The second terminals CD2 may be electrically connected to external circuits via second terminal lines 52 and may receive control signals.

The third terminals CD3 may be connected to the third pads PD3 via the anisotropic conductive film AD1. The third terminals CD3 may be connected to external circuits or external power sources via third terminal lines 53 and may receive driving voltages.

The fourth terminals CD4 may be connected to the fourth pads PD4 via the anisotropic conductive film AD1. The fourth terminals CD4 may be connected to external circuits or external power sources via the fourth terminal lines 54 and may receive a common voltage.

The fifth terminals CD5 may be connected to the fifth pads PD5 via the anisotropic conductive film AD1. The fifth terminals CD5 may not be connected to external circuits or the driver D-IC of FIG. 2. That is, the fifth terminals CD5 may be dummy terminals and may be coupled to the fifth pads PD5 for improving a coupling force, but not to any particular terminal lines.

The sixth terminals CD6 may be connected to the sixth pads PD6 via the anisotropic conductive film AD1. The sixth terminals CD6 may be indentation terminals for inspecting indentations or conductive balls. The sixth terminals CD6 may not be connected to any particular terminal lines.

The seventh terminals CD7 may be connected to the seventh pads PD7 via the anisotropic conductive film AD1. The seventh terminals CD7 may be alignment terminals that are aligned with the seventh pads PD7.

The seventh terminals CD7 may include first terminal portions CD7*a* extending in the second direction y and second terminal portions CD7*b* connected to the first terminal portions CD7*a* and extending in the first direction x, particularly, in the direction opposite to the direction in which the second pad portions PD7*b* extend. The first terminal portions CD7*a* may be connected directly to the sixth terminals CD6. When the seventh terminals CD7 and the seventh pads PD7 are aligned, the first terminal portions CD7*a* may overlap with the first pad portions PD7*a*, but the second terminal portions CD7*b* may not overlap with the first pad portions PD7*a* and the second pad portions PD7*b*. In some exemplary embodiments, the seventh terminals CD7 and the seventh pads PD7 may be aligned to form cross shapes.

In some exemplary embodiments, the seventh terminals CD7 may not be connected to any particular terminal lines.

Referring to FIG. 13, the fifth pads PD5, which are dummy pads, the sixth pads PD6, which are indentation pads, and the seventh pads PD7, which are alignment pads, may be disposed closer than other signal pads (e.g., the fourth pads PD4), to which voltages or signals for driving the display panel DP are provided, to the edges ED of the display panel DP. Thus, static electricity ES is more likely to be introduced into the fifth pads PD5, the sixth pads PD6, and the seventh pads PD7 than into the fourth pads PD4.

In a case where the static electricity ES is introduced into the fifth pads PD5, the sixth pads PD6, and the seventh pads PD7, the static electricity ES may move to other signal pads, for example, to the fourth signal pads PD4, thereby causing damage to signal lines such as the fourth connecting lines 14.

Since the fifth pads PD5, the sixth pads PD6, and the seventh pads PD7 are electrically connected to the common voltage supply line ESL, the static electricity ES introduced into the fifth pads PD5, the sixth pads PD6, and the seventh pads PD7 may be distributed to the common voltage supply line ESL. That is, the common voltage supply line ESL may serve as an electrostatic dispersion line for distributing the static electricity ES introduced into the fifth pads PD5, the sixth pads PD6, and the seventh pads PD7. Accordingly, signal pads and signal lines may be prevented from being damaged by the static electricity ES introduced into the fifth pads PD5, the sixth pads PD6, and the seventh pads PD7, and the reliability of the display device 1 may be improved.

Figure 14:
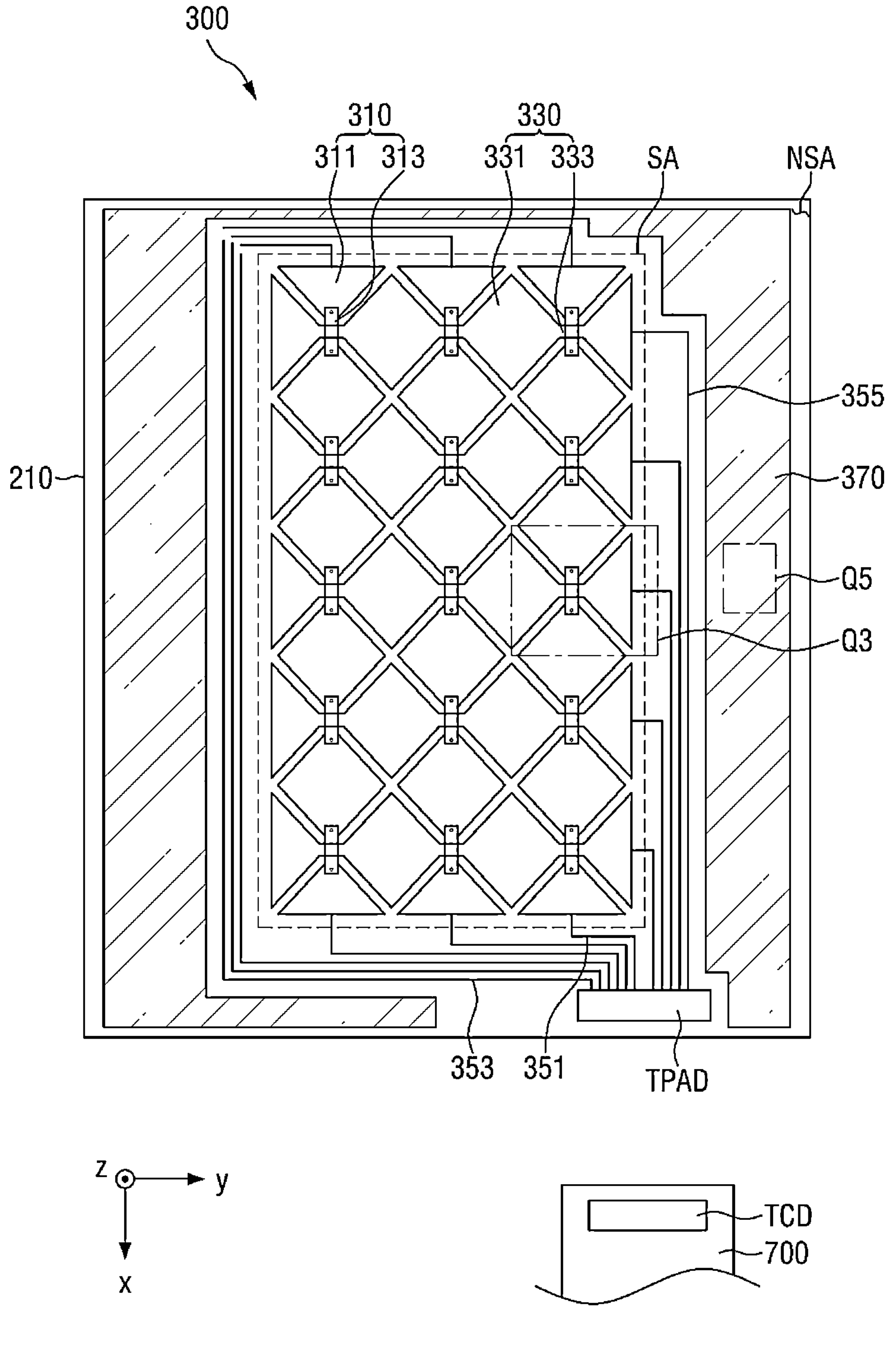
FIG. 14 is a plan view illustrating a touch sensing layer of the display device of FIG. 1.
Figure 15:
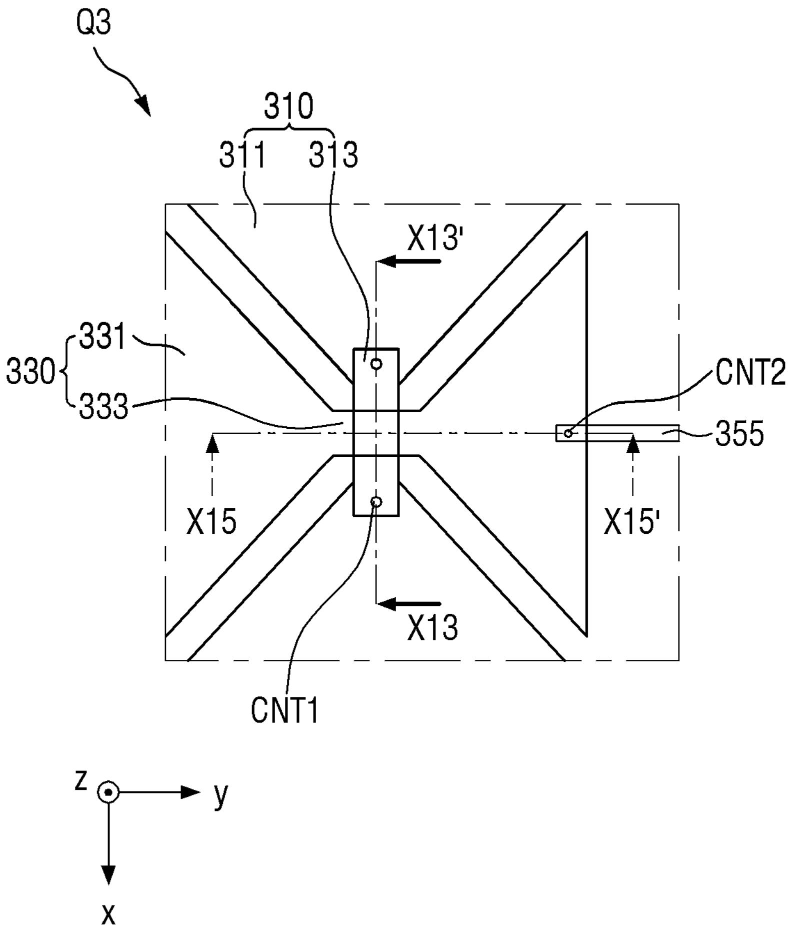
FIG. 15 is an enlarged plan view of a part Q3 of FIG. 14.
Figure 16:
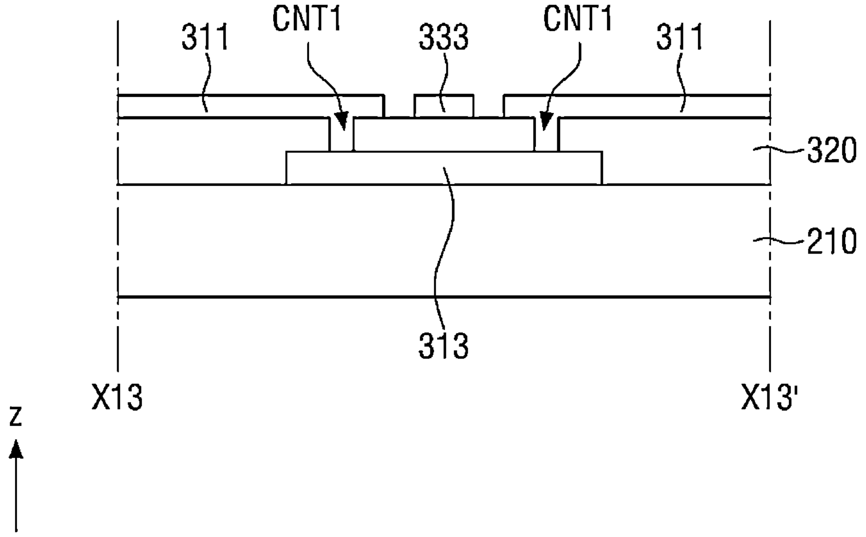
FIG. 16 is a cross-sectional view, taken along line X13-X13' of FIG. 15, of the touch sensing layer.
Figure 17:
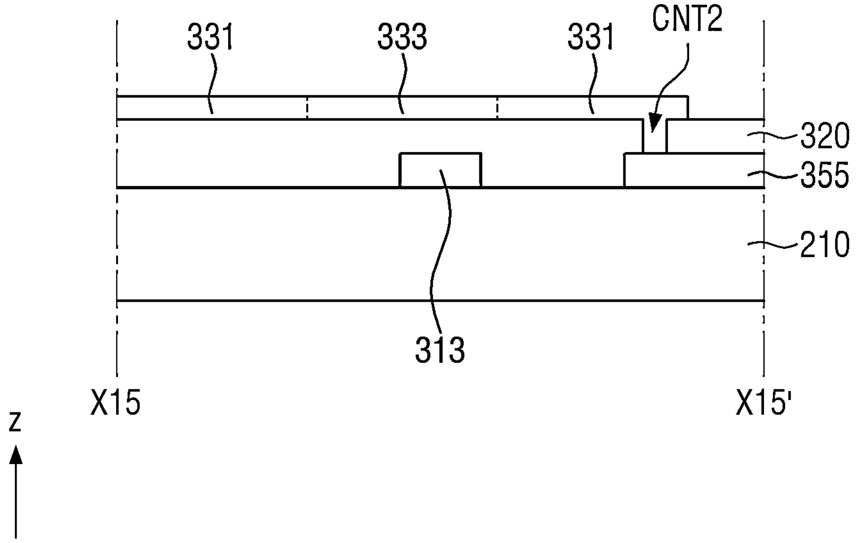
FIG. 17 is a cross-sectional view, taken along line X15-X15' of FIG. 15, of the touch sensing layer.
Figure 18:
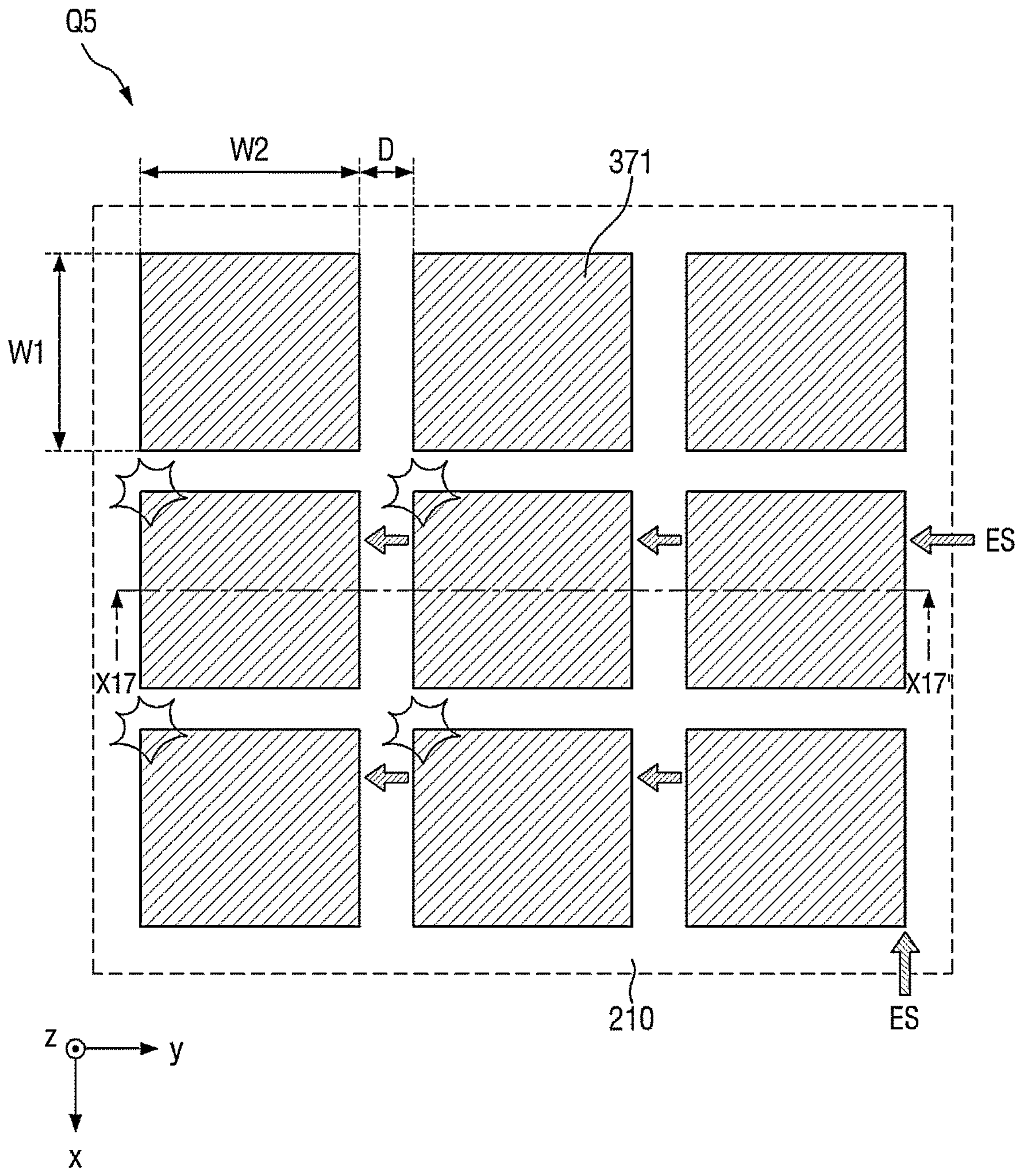
FIG. 18 is a plan view illustrating a part Q5 of FIG. 14 to show the path of movement of static electricity introduced from the outside of the display device of FIG. 1.
Figure 19:
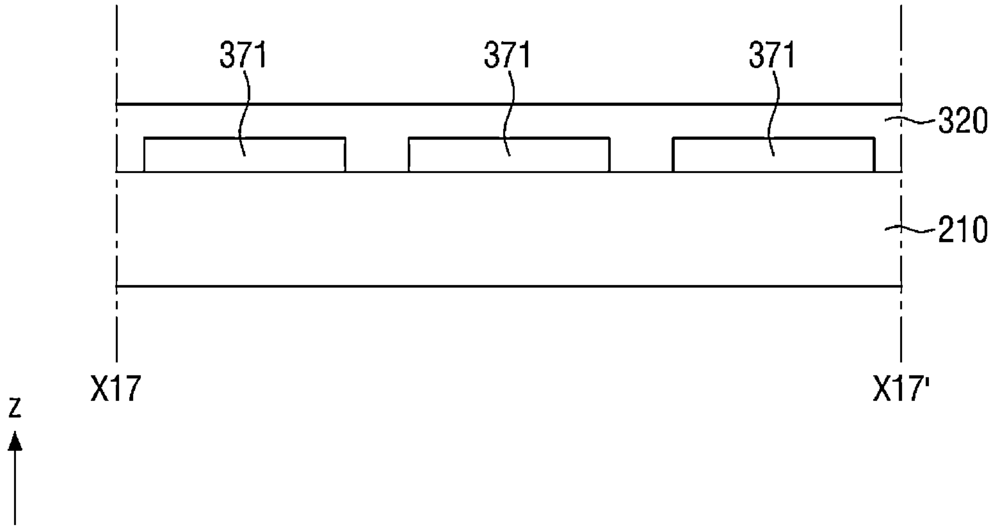
FIG. 19 is a cross-sectional view, taken along line X17-X17' of FIG. 18, of the touch sensing layer.
Figure 20:
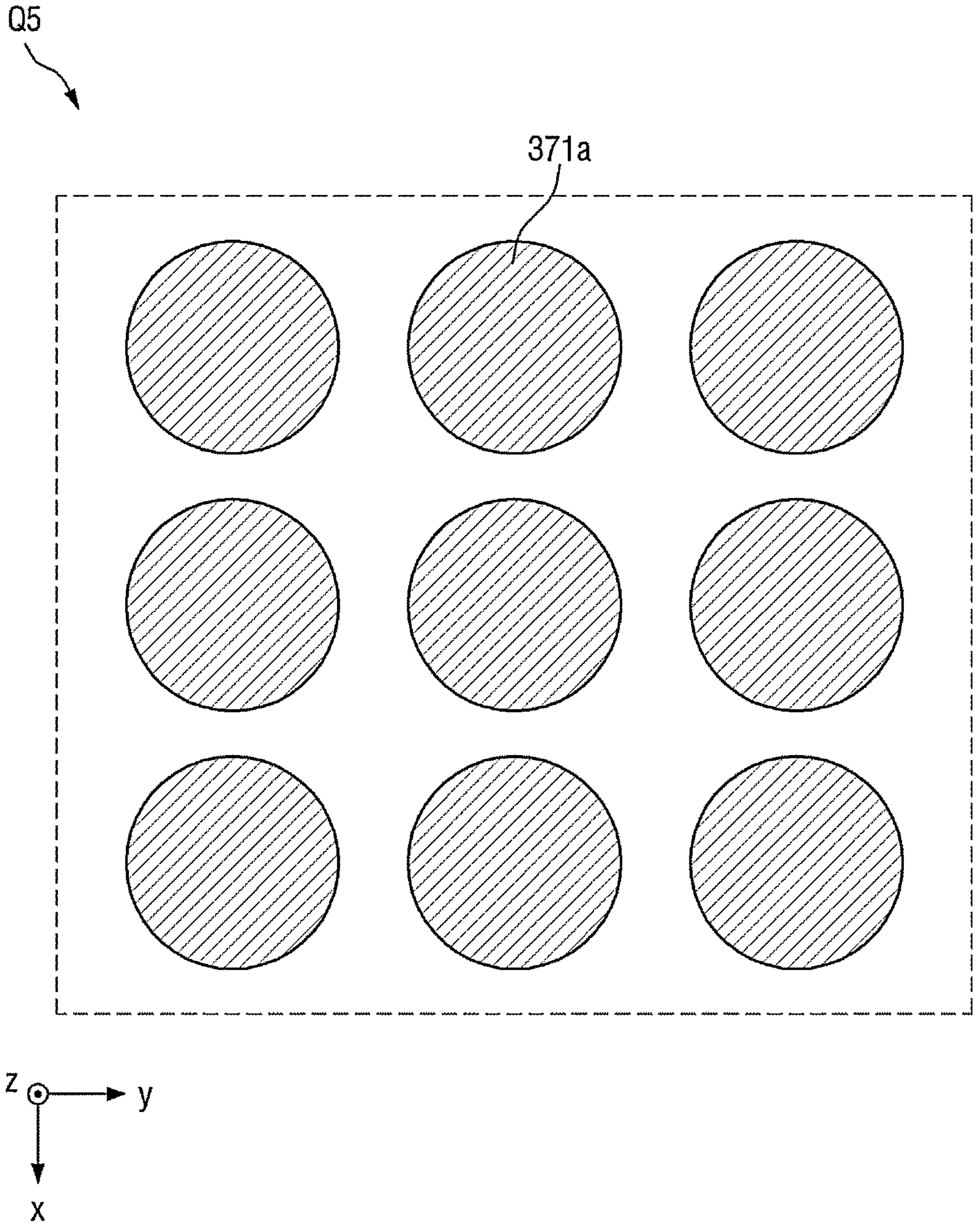
FIG. 20 is a plan view illustrating a modified example of the part Q5 of FIG. 18.
Figure 21:
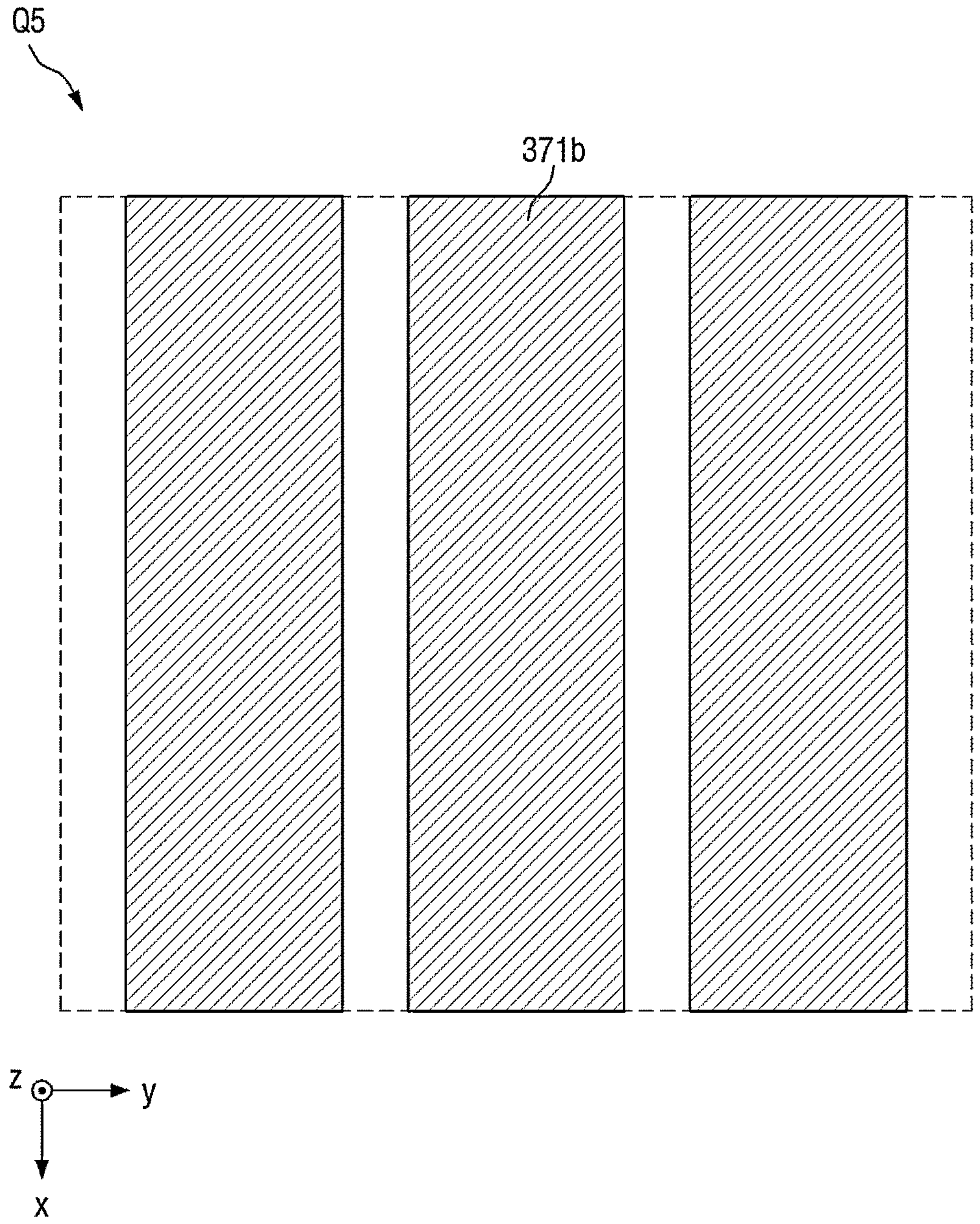
FIG. 21 is a plan view illustrating another modified example of the part Q5 of FIG. 18.

FIG. 14 is a plan view illustrating the touch sensing layer of the display device of FIG. 1, FIG. 15 is an enlarged plan view of a part Q3 of FIG. 14, FIG. 16 is a cross-sectional view, taken along line X13-X13' of FIG. 15, of the touch sensing layer of the display device of FIG. 1, FIG. 17 is a cross-sectional view, taken along line X15-X15' of FIG. 15, of the touch sensing layer of the display device of FIG. 1, FIG. 18 is a plan view illustrating a part Q5 of FIG. 14 to show the path of movement of static electricity introduced from the outside of the display device of FIG. 1, FIG. 19 is a cross-sectional view, taken along line X17-X17' of FIG. 18, of the touch sensing layer of the display device of FIG. 1, FIG. 20 is a plan view illustrating a modified example of the part Q5 of FIG. 18, and FIG. 21 is a plan view illustrating another modified example of the part Q5 of FIG. 18.

Referring to FIGS. 14 through 21, the touch sensing layer 300 is disposed on the second substrate 210.

In the touch sensing layer 300, a sensing area SA and a peripheral area NSA are defined. The sensing area SA may be an area that may detect touch input, and the peripheral area NSA may be an area that cannot detect touch input.

The sensing area SA and the peripheral area NSA may correspond to the display area DA and the non-display area NDA, respectively, of the display device 1 of FIG. 1 or 4. In some exemplary embodiments, the sensing area SA may be substantially the same as the display area DA.

In the sensing area SA, first electrode portions 310 and second electrode portions 330 may be disposed on the second substrate 210.

In the peripheral area NSA, the touch pad portion TPAD, touch signal lines (351, 353, and 355), and an electrostatic discharge portion 370 may be disposed on the second substrate 210.

The sensing area SA will hereinafter be described.

The first electrode portions 310 and the second electrode portions 330, which are insulated from the first electrode portions 310, may be disposed on the second substrate 210.

The first electrode portions 310 may extend in the first direction x. A plurality of first electrode portions 310 may be provided and may be spaced apart from one another in the second direction y.

Each of the first electrode portions 310 may include a plurality of first touch electrodes 311 arranged in the first direction x and first connectors 313 electrically connecting pairs of adjacent first touch electrodes 311 in the first direction x. The term "connect" or "connection", as used herein, encompasses physical and/or electrical connection.

In some exemplary embodiments, the first touch electrodes 311 may have a rhombic shape in a plan view, as illustrated in FIGS. 14 and 15, but the invention is not limited thereto. That is, in other exemplary embodiments, the first touch electrodes 311 may have various shapes other than a rhombic shape, such as a triangular, rectangular, pentagonal, circular, or bar shape, in a plan view.

The first touch electrodes 311 may include a transparent conductive material. In an exemplary embodiment, the transparent conductive material may be a conductive polymer such as silver nanowire (AgNW), indium tin oxide ("ITO"), indium zinc oxide ("IZO"), antimony zinc oxide ("AZO"), indium tin zinc oxide ("ITZO"), zinc oxide (ZnO), tin oxide ($SnO_2$), carbon nanotube ("CNT"), graphene, or poly(3,4-ethylenedioxythiophene) ("PEDOT"), for example. When light transmittance is secured, the first touch electrodes 311 may include a conductive material such as a metal or an alloy thereof. Here, the metal may be gold (Au), silver (Ag), aluminum (Al), molybdenum (Mo), chromium (Cr), titanium (Ti), nickel (Ni), neodymium (Nd), Cu, or platinum (Pt). In some exemplary embodiments, when the first touch electrodes 311 include a metal or an alloy thereof, the first touch electrodes 311 may be provided into a mesh structure not to become visible to a user, in which case, the first touch electrodes 311 may be disposed not to overlap with the light-emitting area PXA of FIG. 6.

The first connectors 313 may electrically connect the pairs of adjacent first touch electrodes 311 in the first direction x and may be in contact with the first touch electrodes 311. In some exemplary embodiments, the first connectors 313 may be provided as bridge-shape connecting patterns. In some exemplary embodiments, the first connectors 313 may be disposed in a different layer from the first touch electrodes 311.

The first connectors 313 may include a conductive material. In some exemplary embodiments, the first connectors 313 may include a metal such as Au, Ag, Al, Mo, Cr, Ti, Ni, Nd, Cu, or Pt or an alloy thereof. In some exemplary embodiments, the first connectors 313 may have a single-layer structure or a multilayer structure. In an exemplary embodiment, the first connectors 313 may have a triple-layer structure of Ti/Al/Ti, for example.

FIGS. 14 through 16 illustrate that one first connector 313 is disposed between each pair of adjacent first touch electrodes 311 in the first direction x, but the number of first connectors 313 provided between each pair of adjacent first touch electrodes 311 in the first direction x may vary. That is, two or more first connectors 313 may be disposed between each pair of adjacent first touch electrodes 311 in the first direction x.

In some exemplary embodiments, an insulating layer 320 may be disposed between the first touch electrodes 311 and the first connectors 313. That is, the first connectors 313 may be disposed on the second substrate 210, the insulating layer 320 may be disposed on the first connectors 313, and the first touch electrodes 311 may be disposed on the insulating layer 320. The first connectors 313 and the first touch electrodes 311 may be connected through first contact holes CNT1 defined in the insulating layer 320.

The insulating layer 320 may include an insulating material. In some exemplary embodiments, the insulating material may be an inorganic insulating material or an organic insulating material. In an exemplary embodiment, the inorganic insulating material may include at least one of aluminum oxide, titanium oxide, silicon oxide, silicon oxynitride, zirconium oxide, and hafnium oxide, for example. In an exemplary embodiment, the organic insulating material may include at least one of an acrylic resin, a methacrylic resin, polyisoprene, a vinyl resin, an epoxy resin, a urethane resin, a cellulose resin, a siloxane resin, a polyimide resin, a polyamide resin, and a perylene resin, for example.

The second electrode portions 330 may extend in the second direction y. A plurality of second electrode portions 330 may be provided and may be spaced apart from one another in the first direction x.

Each of the second electrode portions 330 may include a plurality of second touch electrodes 331 arranged in the second direction y and second connectors 333 electrically connecting pairs of adjacent second touch electrodes 331 in the second direction y.

In some exemplary embodiments, the second touch electrodes 331 may be disposed in the same layer as the first touch electrodes 311. In an exemplary embodiment, the second touch electrodes 331 may be disposed on the insulating layer 320, for example. The second touch electrodes 331 may have a rhombic shape in a plan view, but the invention is not limited thereto. That is, the second touch electrodes 331 may have various shapes other than a rhombic shape, such as a triangular, rectangular, pentagonal, circular, or bar shape, in a plan view.

The second touch electrodes 331 may include a conductive material. In some exemplary embodiments, the second touch electrodes 331 may include the same material as that of the first touch electrodes 311.

The second connectors 333 may electrically connect the pairs of adjacent second touch electrodes 331 in the second direction y and may be in contact with the second touch electrodes 331. In some exemplary embodiments, the second connectors 333 may be disposed in the same layer as the first touch electrodes 311 and the second touch electrodes 331. In an exemplary embodiment, the second connectors 333, like the first touch electrodes 311 and the second touch electrodes 331, may be disposed on the insulating layer 320, for example.

In some exemplary embodiments, the second connectors 333 may be insulated from the first connectors 313 or the first touch electrodes 311 by the insulating layer 320. FIGS. 14, 15, and 17 illustrate that the second connectors 333 overlap with the first connectors 313, but the invention is not limited thereto. In an alternative exemplary embodiment, the second connectors 333 may overlap with the first touch electrodes 311, but not with the first connectors 313.

The second connectors 333 may include the same material as that of the first touch electrodes 311 and the second touch electrodes 331.

In some exemplary embodiments, the first electrode portions 310 may be driving electrode portions receiving driving signals for detecting the location of touch input, and the second electrode portions 330 may be sensing electrode portions outputting sensing signals in response to the driving signals.

The peripheral area NSA will hereinafter be described.

In the peripheral area NSA, the touch signal lines (351, 353, and 355) and the touch pad portion TPAD may be disposed on the second substrate 210.

In an exemplary embodiment, the touch signal lines (351, 353, and 355) may include first touch signal lines 351, second touch signal lines 353, and third touch signal lines 355, for example. The first touch signal lines 351 and the second touch signal lines 353 may be electrically connected to the first electrode portions 310, and the third touch signal lines 355 may be electrically connected to the second electrode portions 330.

In some exemplary embodiments, as illustrated in FIG. 14, first ends of the first touch signal lines 351 may be connected to first ends of the first electrode portions 310, and second ends of the first touch signal lines 351 may be connected to the touch pad portion TPAD. Also, first ends of the second touch signal lines 353 may be connected to second ends of the first electrode portions 310, and second ends of the second touch signal lines 353 may be connected to the touch pad portion TPAD.

That is, the touch signal lines connected to the first electrode portions 310 may be configured into a double routing structure, and as a result, RC delays that may be caused by the resistances of the first electrode portions 310 may be improved. In some exemplary embodiments, the first ends of the first electrode portions 310 may be connected to the first touch signal lines 351 through the insulating layer 320, and the second ends of the first electrode portions 310 may be connected to the second touch signal lines 353 through the insulating layer 320.

First ends of the third touch signal lines 355 may be electrically connected to the second electrode portions 330, and second ends of the third touch signal lines 355 may be electrically connected to the touch pad portion TPAD. In some exemplary embodiments, first ends of the second electrode portions 330 may be connected to the third touch signal lines 355 through the insulating layer 320. In an exemplary embodiment, the second electrode portions 330 may be connected to the third touch signal lines 355 through second contact holes CNT2 defined in the insulating layer 320, for example.

In some exemplary embodiments, the first touch signal lines 351, the second touch signal lines 353, and the third touch signal lines 355 may include the same material as that of the first connectors 313 and may be disposed in the same layer as the first connectors 313. In an exemplary embodiment, the first touch signal lines 351, the second touch signal lines 353, and the third touch signal lines 355 may be disposed between the second substrate 210 and the insulating layer 320, for example.

In the peripheral area NSA, the touch pad portion TPAD may be disposed on the second substrate 210 and may be connected to the touch signal lines (351, 353, and 355). The touch pad portion TPAD may include touch pads (not illustrated) connected to the touch signal lines (351, 353, and 355).

As already mentioned above, the touch pad portion TPAD may be connected to the touch terminal portion TCD of the touch FPCB 700 via the anisotropic conductive film AD2 (refer to FIG. 3).

In the peripheral area NSA, the electrostatic discharge portion 370 may be disposed on the second substrate 210. The electrostatic discharge portion 370 may be spaced apart from the touch signal lines (351, 353, and 355) and may be disposed closer than the touch signal lines (351, 353, and 355) to the edges of the second substrate 210. In other words, the touch signal lines (351, 353, and 355) may be disposed between the sensing area SA and the electrostatic discharge portion 370.

In some exemplary embodiments, the electrostatic discharge portion 370 may be substantially in the form of a loop with one side opened and may extend along all the edges of the second substrate 210, except for the edge corresponding to the touch pad portion TPAD, to surround the touch signal lines (351, 353, and 355).

Since the electrostatic discharge portion 370 is disposed on the outside of the touch signal lines (351, 353, and 355), static electricity ES may be prevented from being introduced into the touch signal lines (351, 353, and 355), and as a result, damage to the touch signal lines (351, 353, and 355) may be prevented.

The electrostatic discharge portion 370 may include a conductive material. In some exemplary embodiments, the electrostatic discharge portion 370, like the first touch signal lines 351, the second touch signal lines 353, and the third touch signal lines 355, may include the same material as that of the first connectors 313 and may be disposed in the same layer as the first connectors 313. In some exemplary embodiments, the electrostatic discharge portion 370 may not overlap with the first touch signal lines 351, the second touch signal lines 353, and the third touch signal lines 355 in a plan view.

In some exemplary embodiments, the electrostatic discharge portion 370 may be in a state of not being provided with any particular signals or voltages, i.e., in a floating state.

The electrostatic discharge portion 370 may include a plurality of conductive patterns 371 spaced apart from one another. In some exemplary embodiments, the conductive patterns 371 may be spaced apart from one another in the first and second directions x and y.

In some exemplary embodiments, a width W1, in the first direction x, of the conductive patterns 371 and a width W2, in the second direction y, of the conductive patterns 371 may be about 25 micrometers (μm) to about 35 μm, and a distance D between the conductive patterns 371 may be about 3 μm to about 5 μm, for example.

Since the electrostatic discharge portion 370 includes the conductive patterns 371, which are spaced apart from one another, the static electricity ES is highly likely to be discharged in one of the conductive patterns 371, rather than arriving at the touch signal lines (351, 353, and 355). Accordingly, the touch signal lines (351, 353, and 355) may be prevented from being damaged by the static electricity ES.

In some exemplary embodiments, the conductive patterns 371 may have a rectangular shape in a plan view, as illustrated in FIG. 18, but the invention is not limited thereto. In an alternative exemplary embodiment, the conductive patterns 371 may have another polygonal shape such as a triangular, pentagonal, or hexagonal shape in a plan view.

The planar shape of the conductive patterns 371 is not particularly limited, but may vary.

In an exemplary embodiment, as illustrated in FIG. 20, conductive patterns 371*a* may have a circular shape (or an elliptical shape) in a plan view, for example. Also, for example, as illustrated in FIG. 21, conductive patterns 371*b* may be provided as stripes.

While the invention has been particularly illustrated and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:

1. A display device defining a first direction, a second direction orthogonal to the first direction, and a third direction orthogonal to the first direction and the second direction, comprising:

a first substrate including a display area and a non-display area, which is on a periphery of the display area;

a light-emitting element disposed on the first substrate and in the display area;

a second substrate disposed over the light-emitting element, the second substrate including a sensing area and a peripheral area which is on a periphery of the sensing area; and a touch sensing layer disposed on the second substrate, wherein the touch sensing layer comprises:

a touch electrode portion disposed in the sensing area, touch signal lines disposed in the peripheral area and connected to the touch electrode portion, a touch pad portion disposed in the peripheral area, and an electrostatic discharge portion disposed in the peripheral area and space apart from the touch signal lines, wherein the touch signal lines are electrically connected to the touch pad portion, wherein the electrostatic discharge portion is not electrically connected to the touch pad portion, wherein the touch signal lines are disposed between the sensing area and the electrostatic discharge portion, wherein the third direction is a thickness direction of the display device, wherein at least one of the touch signal lines extends from a first side of the touch electrode portion along the first direction, extends around a side of the touch electrode portion along the second direction, and extends to the touch pad portion positioned on a second side of the touch electrode portion along the first direction such that a portion thereof in contact with the touch pad portion overlaps at least one touch electrode of the touch electrode portion in the first direction.

2. The display device of claim 1, wherein the electrostatic discharge portion is disposed to surround the sensing area and the touch signal lines.

3. The display device of claim 2, wherein the electrostatic discharge portion includes a conductive material, and another conductive material is not interposed between the electrostatic discharge portion and edges of the second substrate.

4. The display device of claim 2, wherein the electrostatic discharge portion has a line shape which is bent a plurality of times and both first end and second end of the electrostatic discharge portion face the touch pad portion.

5. The display device of claim 2, wherein a line width of the electrostatic discharge portion is greater that line widths of the touch signal lines.

6. The display device of claim 1, wherein the touch signal lines and the electrostatic discharge portion include the same material and disposed in a same layer.

7. The display device of claim 1, wherein the touch electrode portion comprises first touch electrodes arranged along the first direction and electrically connected to one another in the first direction and second touch electrodes arranged along the second direction and electrically connected to one another in the second direction, the first touch electrodes and the second touch electrodes are disposed in the same layer, and the electrostatic discharge portion is disposed in a different layer from the first touch electrodes and the second touch electrodes.

8. The display device of claim 7, wherein the touch electrode portion further comprises first connectors connecting pairs of adjacent first touch electrodes in the first direction and second connectors connecting pairs of adjacent second touch electrodes in the second direction, the first connectors are disposed in a different layer from the electrostatic discharge portion, and the second connectors are disposed in a same layer as the electrostatic discharge portion.

* * * * *